United States Patent
Shero et al.

(10) Patent No.: US 7,122,085 B2
(45) Date of Patent: Oct. 17, 2006

(54) SUBLIMATION BED EMPLOYING CARRIER GAS GUIDANCE STRUCTURES

(75) Inventors: Eric J. Shero, Phoenix, AZ (US); Michael E. Givens, Phoenix, AZ (US); Ryan Schmidt, Mesa, AZ (US)

(73) Assignee: ASM America, Inc., Phoenix, AZ (US)

( * ) Notice: Subject to any disclaimer, the term of this patent is extended or adjusted under 35 U.S.C. 154(b) by 226 days.

(21) Appl. No.: 10/629,029

(22) Filed: Jul. 29, 2003

(65) Prior Publication Data

US 2005/0072357 A1 Apr. 7, 2005

Related U.S. Application Data

(60) Provisional application No. 60/400,210, filed on Jul. 30, 2002.

(51) Int. Cl.
*C23C 16/448* (2006.01)

(52) U.S. Cl. .......................... 118/726; 34/209; 34/211; 34/215; 34/226; 392/388; 392/389

(58) Field of Classification Search ........ 392/388–389; 118/726; 34/209, 211, 215, 226
See application file for complete search history.

(56) References Cited

U.S. PATENT DOCUMENTS

| | | | |
|---|---|---|---|
| 4,548,138 A | 10/1985 | Korenberg | |
| 4,747,367 A * | 5/1988 | Posa | 118/715 |
| 4,761,269 A * | 8/1988 | Conger et al. | 118/679 |
| 4,883,362 A | 11/1989 | Gartner et al. | |
| 4,947,790 A | 8/1990 | Gärtner et al. | |
| 5,551,278 A | 9/1996 | Rounbehler et al. | |
| 5,553,395 A * | 9/1996 | Wen et al. | 34/359 |
| 5,674,574 A | 10/1997 | Atwell et al. | |
| 5,698,037 A | 12/1997 | Stauffer | |
| 5,904,771 A | 5/1999 | Tasaki et al. | |
| 6,033,493 A | 3/2000 | Hertz et al. | |
| 6,132,492 A | 10/2000 | Hultquist et al. | |
| 6,270,839 B1 | 8/2001 | Onoe et al. | |
| 6,325,017 B1 | 12/2001 | DeBoer et al. | |
| 6,720,259 B1 * | 4/2004 | Londergan et al. | 438/680 |
| 2003/0053799 A1 | 3/2003 | Lei | |
| 2004/0016404 A1 | 1/2004 | Gregg et al. | |

FOREIGN PATENT DOCUMENTS

| | | |
|---|---|---|
| DE | 33 39 625 C2 | 1/1991 |
| GB | 2 151 662 A | 7/1985 |
| JP | 011 168092 | 6/1999 |

OTHER PUBLICATIONS

Random House Webster's Unabridged Dictionary 2$^{nd}$ Ed., Random House, 2001, pp. 887 and 888.*
Webster's New World Dictionary, 2$^{nd}$ College Ed., The World Publishing Co., 1972, p. 650.*
Smith, J.M., Chemical Engineering Kinetics, 3rd Edition, McGraw-Hill Book Company, p. 268-291 (1981).
Smith, J.M., Chemical Engineering Kinetics, 3rd Edition, McGraw-Hill Book Company, p. 554-563 (1981).

* cited by examiner

*Primary Examiner*—Richard Bueker
(74) *Attorney, Agent, or Firm*—Knobbe, Martens, Olson & Bear LLP

(57) ABSTRACT

Preferred embodiments of the present invention provides a sublimation system employing guidance structures including certain preferred embodiments having a high surface area support medium onto which a solid source material for vapor reactant is coated. Preferably, a guidance structure is configured to facilitate the repeated saturation of the carrier gas with the solid source for a vapor reactant. Methods of saturating a carrier gas using guidance structures are also provided.

7 Claims, 26 Drawing Sheets

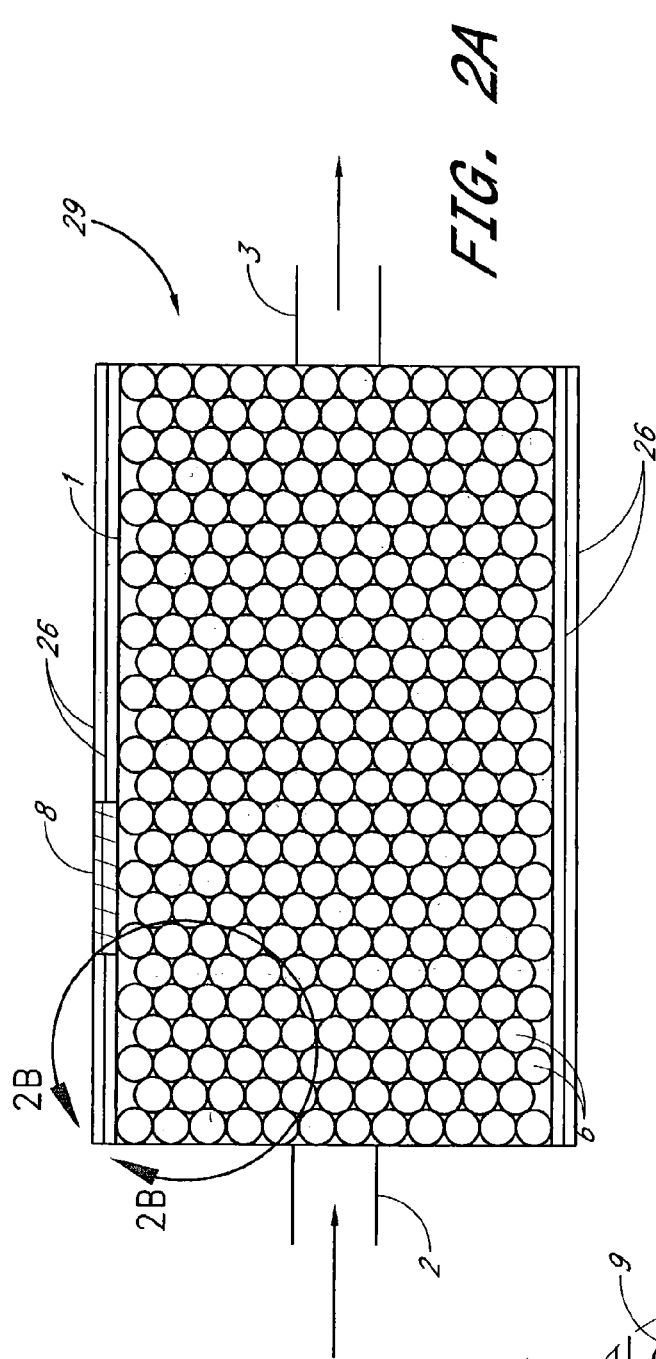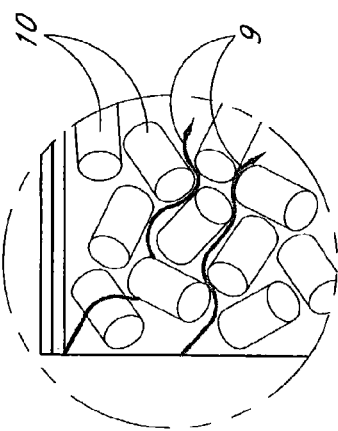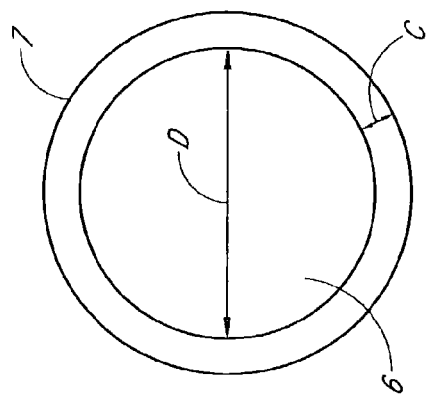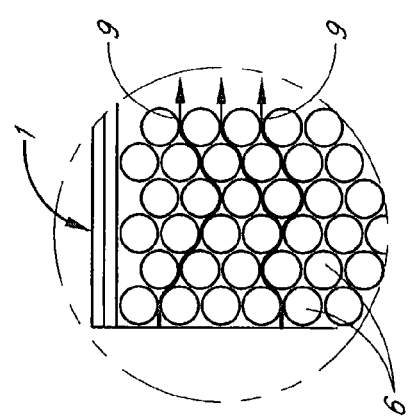
FIG. 2A
FIG. 2B
FIG. 2C
FIG. 2D

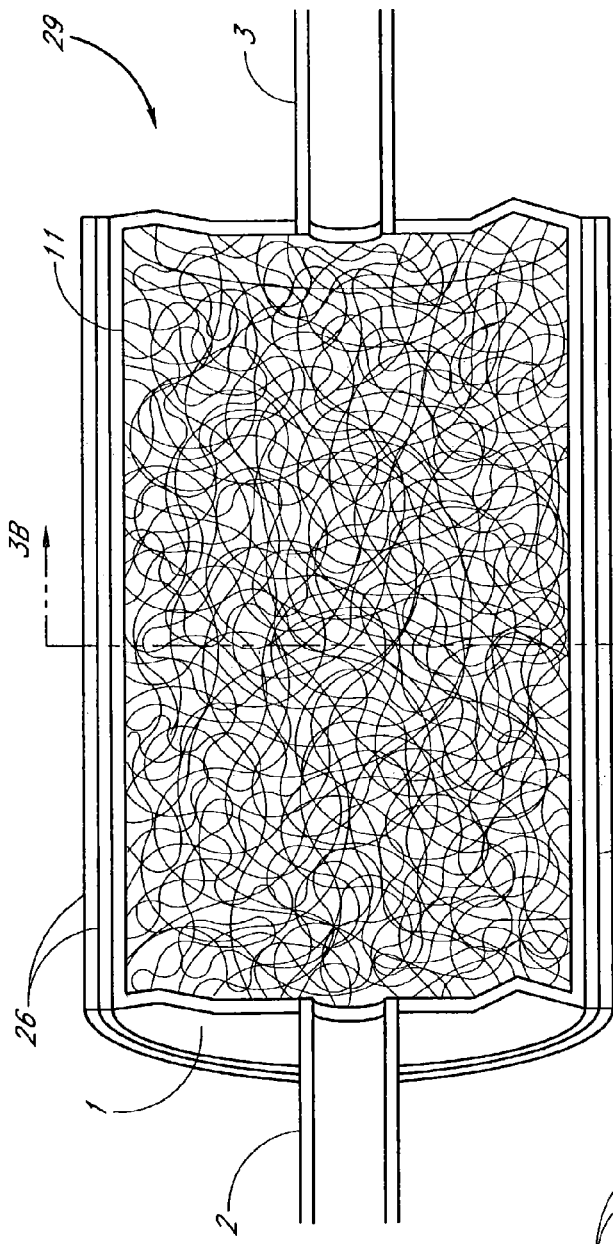
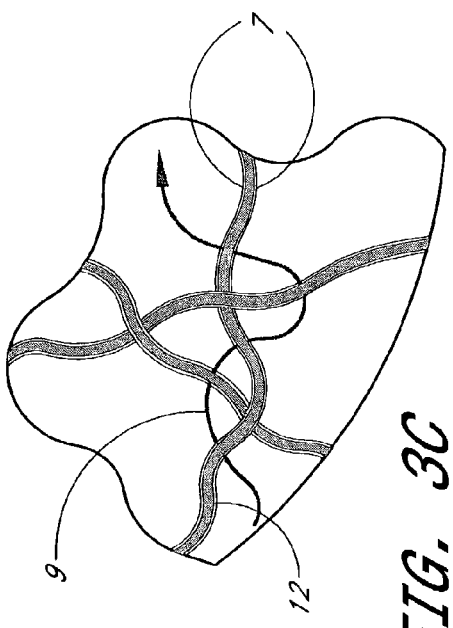
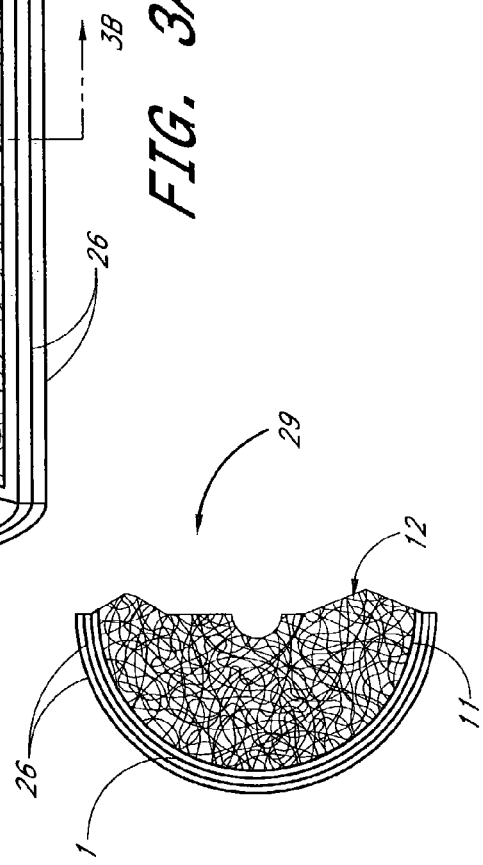
FIG. 3A
FIG. 3B
FIG. 3C

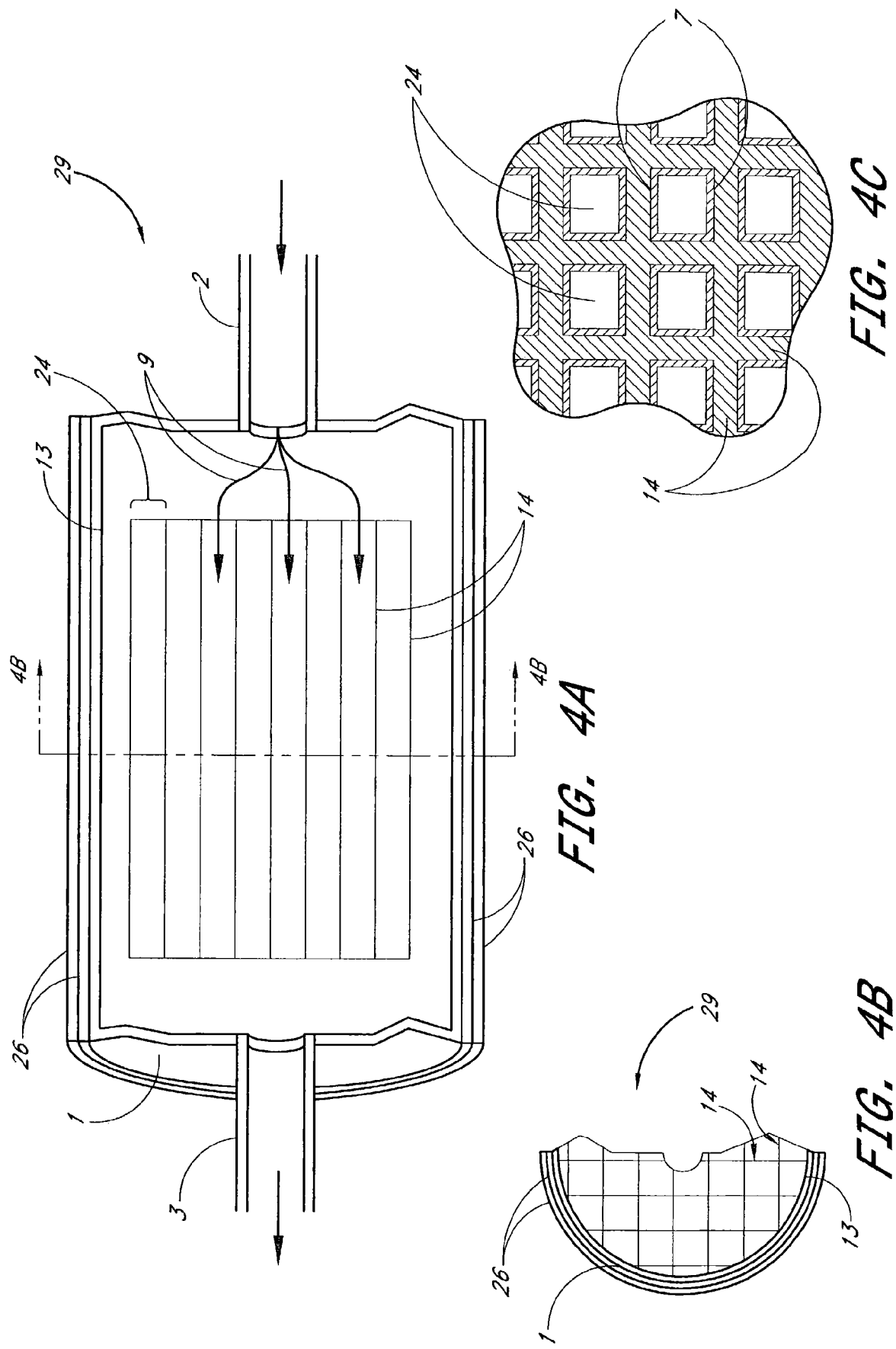

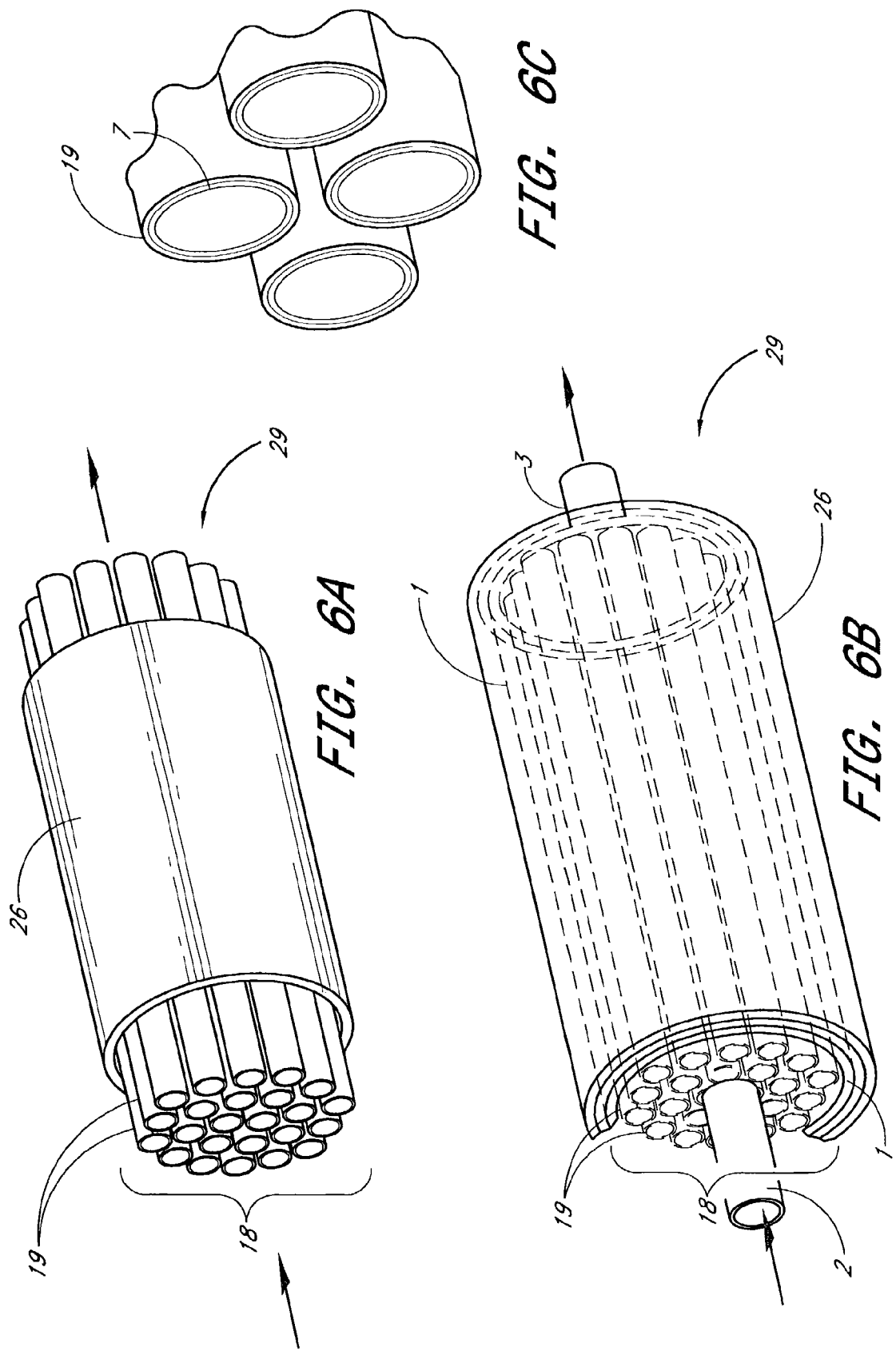

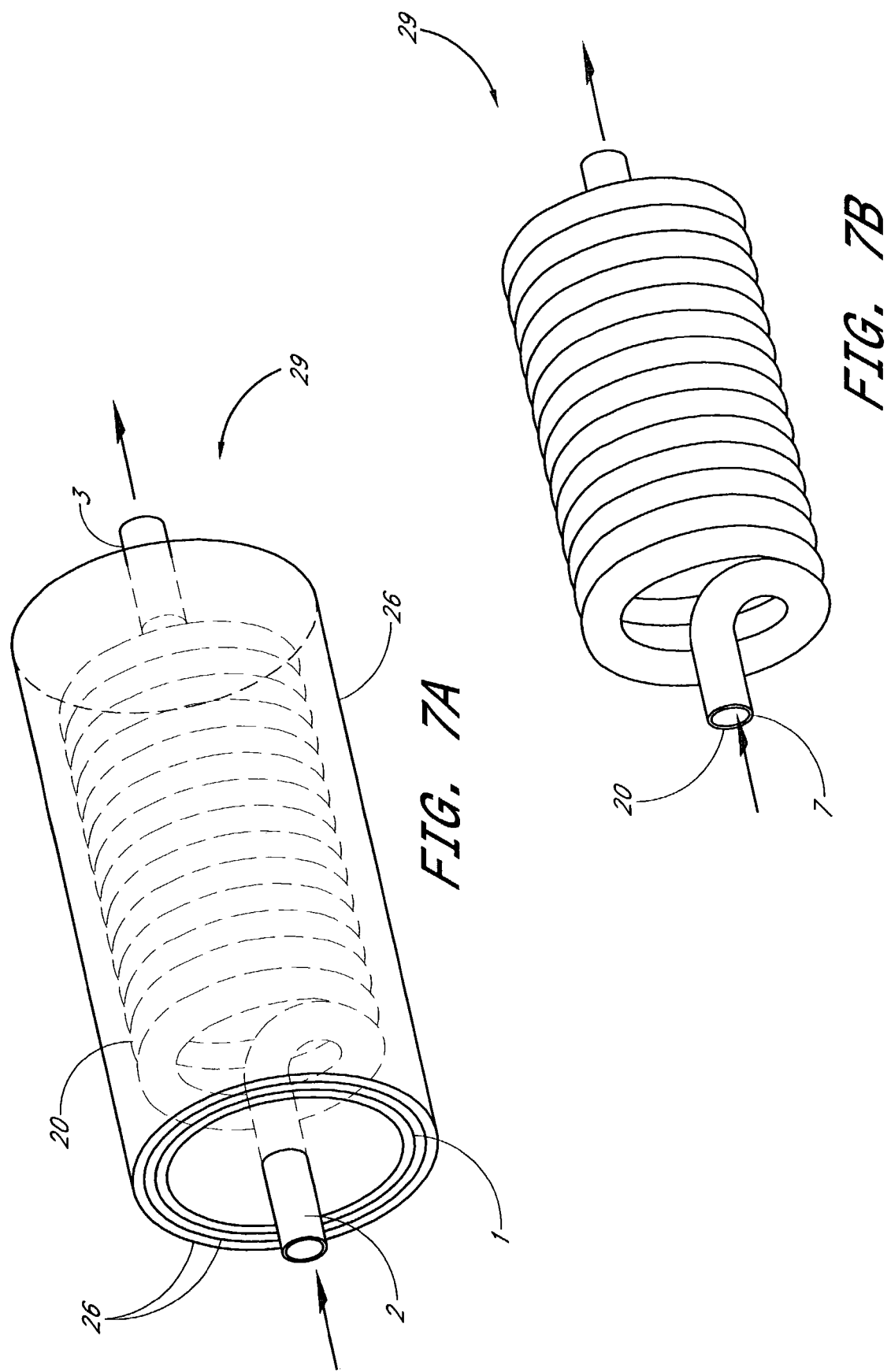

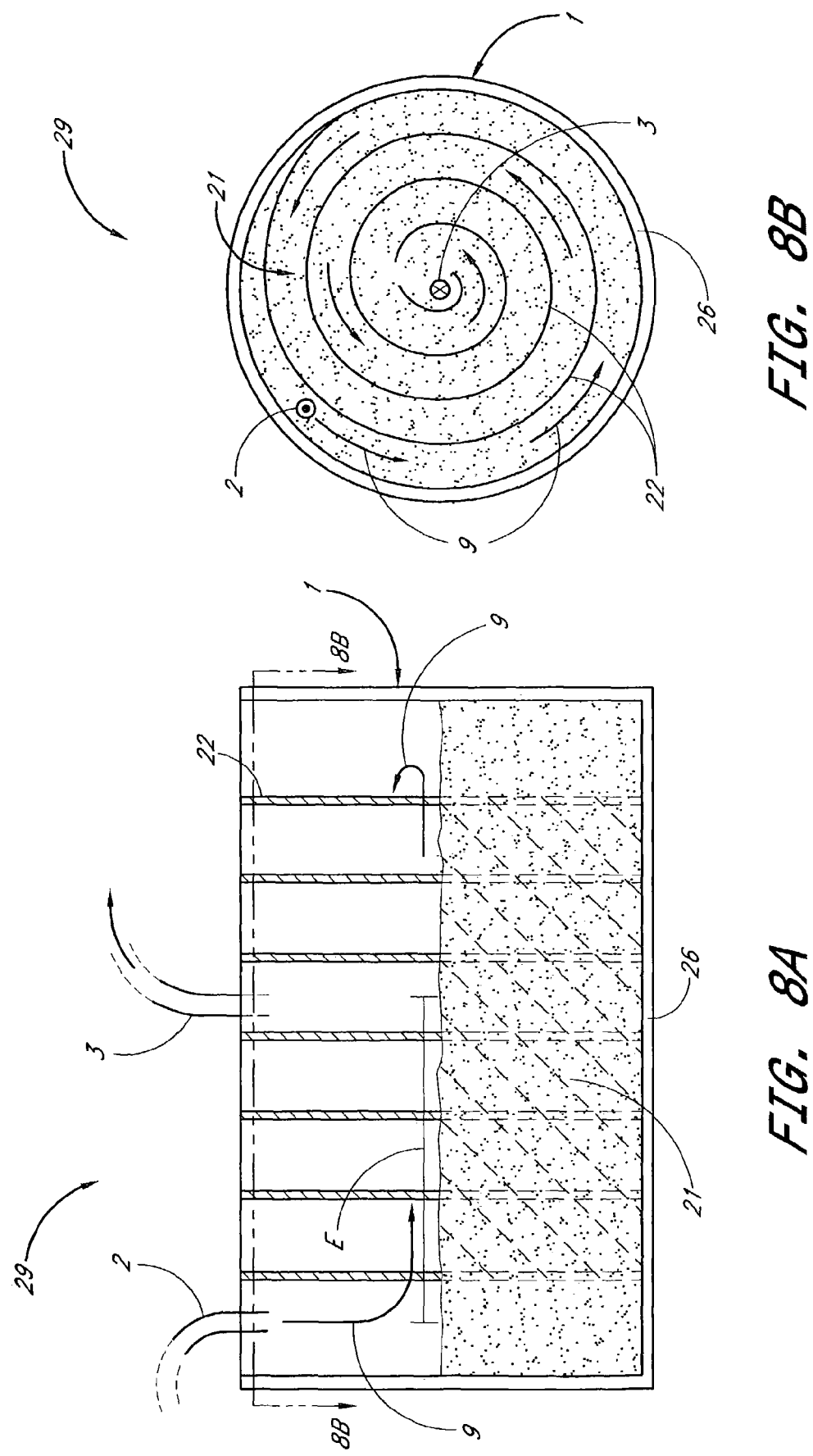

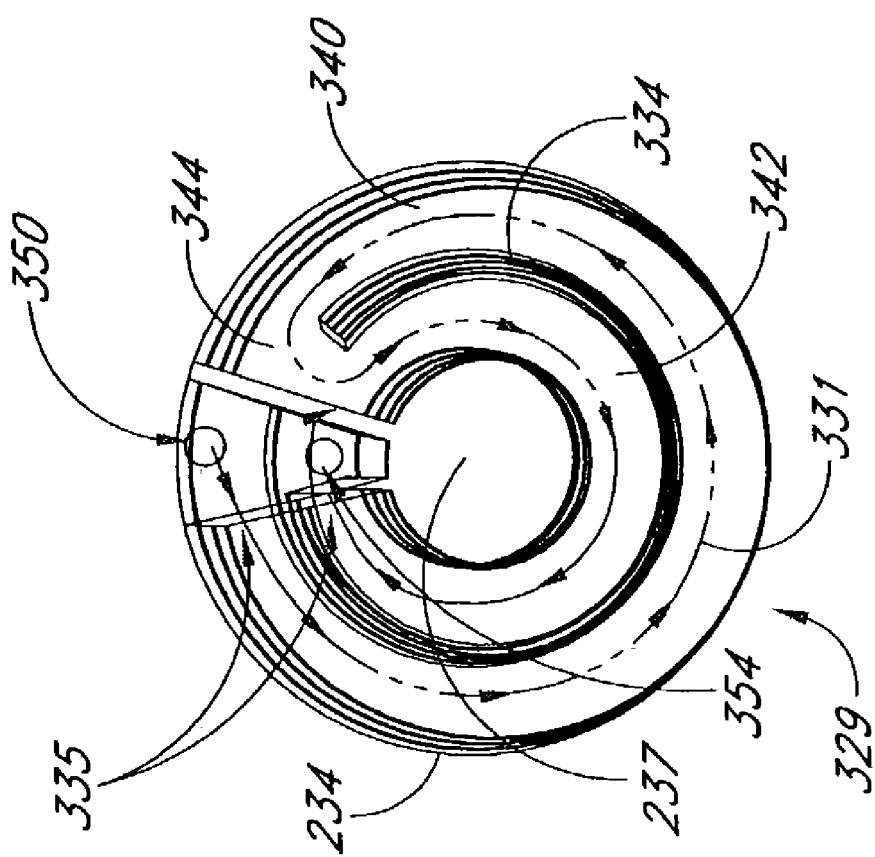
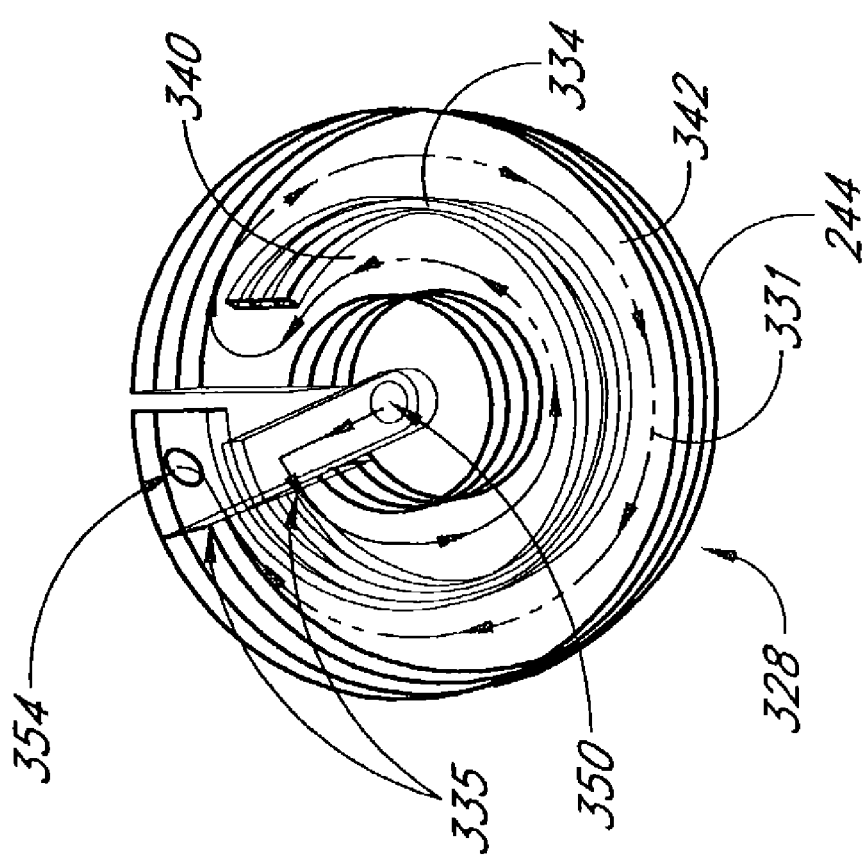
FIG. 20A
FIG. 20B

SUBLIMATION BED EMPLOYING CARRIER GAS GUIDANCE STRUCTURES

REFERENCE TO RELATED APPLICATION

The present application claims the priority benefit under 35 U.S.C. §119(e) of Provisional Application No. 60/400,210, filed on Jul. 30, 2002. The present application is related U.S. application Ser. No. 10/463,309, filed on Jun. 16, 2003.

FIELD OF THE INVENTION

The present invention relates generally to the field of substrate fabrication and, more specifically, to semiconductor processing apparatuses designed to effectively vaporize a solid source material.

BACKGROUND AND SUMMARY OF THE INVENTION

In the fabrication of integrated circuits on substrates, such as semiconductor wafers, the vapor deposition of chemicals, such as chemical vapor deposition ("CVD") and more recently atomic layer deposition (ALD), is often desirable. The expansion of suitable source chemicals has increasingly led to use of precursor materials that are naturally liquid or solid at room temperature and atmospheric pressures.

In order to effectively deposit using precursors from a solid source material or chemical, a solid source material must, of course, first be vaporized. In pursuit of this goal, sublimation apparatuses are used to effectuate the vaporization of a solid source material. In addition, heat sources are often employed in conjunction with such an apparatus in order to increase the vapor pressure above the solid source material.

Unfortunately, existing semiconductor processing systems, of which a sublimation apparatus is a component, have a number of shortcomings including offering both an inadequate ratio of solid source surface area to vapor volume, and poor vapor/solid contact time. Often, current processing systems can allow carrier gas to flow from inlet to outlet without intimately contacting the solid source material, thus preventing the carrier gas from becoming saturated with solid source vapor. In addition, a conventional sublimation bed, which seeks to increase vapor/solid contact time, is often prone to "tunneling." Tunneling results from the tendency of gas to flow preferentially along low resistance paths, rather than through the bulk of the powder, such that progressively smaller solid precursor surface area is exposed to the gas flow as the tunnel through the powder widens. It is thus progressively more difficult to saturate the carrier gas, even though the sublimation bed contains plenty of unvaporized solid source powder.

The present invention provides improved semiconductor processing systems. In the illustrated embodiments, the systems include a guidance structure, such as a support medium having a surface onto which a solid source for vapor reactant is coated. The illustrated guidance structures are configured to facilitate the repeated saturation of the carrier gas with the solid source for a vapor reactant.

In accordance with one aspect of the invention, a substrate processing system is provided with a source of a carrier gas, a support medium having a surface onto which a solid source for vapor reactant is coated and a reaction chamber located downstream of the support medium. The support medium is configured to guide the carrier gas, which originates from the carrier gas source, through the support medium.

In accordance with another aspect of the invention, a sublimation system is provided with a source of carrier gas and flowable support elements onto which a solid source for vapor reactant is coated. The support elements are configured to guide the carrier gas through the support medium in a generally non-linear contact path.

In accordance with yet another aspect of the invention, a sublimation apparatus comprises a sublimation vessel, a bed of a solid source for vapor reactant within the vessel, and a guidance structure configured to guide the carrier gas to contact the vapor reactant from the bed of the solid source material.

In accordance with a preferred embodiment, the guidance structure is configured to segregate and guide the carrier gas over the surface area of the solid bed by providing a winding contact pathway. Preferably, this path is also long and narrow. A vessel inlet port is located at the beginning of the contact pathway, while a vessel outlet port is located at the end of the contact pathway. The carrier gas guidance structure is configured to ensure contact of the carrier gas with the vapor reactant along a substantially segregated and winding contact pathway having a length greater than about 2.5 times a linear distance measured from the inlet port to the outlet port.

In accordance with other preferred embodiments, methods of processing a substrate and methods of performing an atomic layer deposition (ALD) process to deposit a layer on a substrate surface are provided. Preferably, these methods substantially saturate a carrier gas with precursor vapor. In certain preferred embodiments, a substantial plug flow of the carrier gas exits a sublimation vessel substantially saturated with precursor vapor by substantially exhibiting a plug flow residence time distribution by design within said vessel.

A feature of preferred embodiments of the present invention is that a precise and consistent quantity of reactant vapor can be delivered to a deposition chamber at high frequency. An additional feature of the preferred embodiments is an increased ratio of exposed solid source surface area to sublimation vessel volume as a result of, among other factors, the avoidance of problematic "tunneling." Another feature of preferred embodiments is increased vapor/solid contact time. Yet another feature of preferred embodiments is the allowance of relatively even gas flow resistance over the life of a sublimation bed. Another feature of certain preferred embodiments is the production of a substantially plug flow residence time distribution of the carrier gas substantially saturated with precursor vapor.

These and other features are outlined in greater detail in the preferred embodiments described below.

For purposes of summarizing the invention and the advantages achieved over the prior art, certain objects and advantages of the invention have been described herein above. Of course, it is to be understood that not necessarily all such features, objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

FIG. 2A is a schematic cross-section of a sublimation apparatus in accordance with an embodiment of the present invention, the apparatus including a vessel packed with solid source coated beads.

FIG. 2B is a magnified view of the solid source coated beads from FIG. 2A.

FIG. 2C is magnified view of a single solid source coated bead from FIG. 2B.

FIG. 2D is a magnified view of solid source flowable support elements in accordance with an alternate embodiment of the present invention.

FIG. 3A is an isometric cutaway view of a vessel holding a filter, having filter fibers coated with a solid source for vapor reactant, in accordance with another embodiment of the present invention.

FIG. 3B is a cross-section taken along lines 3B—3B in FIG. 3A.

FIG. 3C is a magnified view of a section of the filter shown in FIG. 3B, illustrating the individual solid source coated fibers that form the filter.

FIG. 4A is a isometric cutaway view of a vessel holding a solid source coated, multiple intersecting plate structure in accordance with another embodiment.

FIG. 4B is a cross-section taken along lines 4B—4B in FIG. 4A.

FIG. 4C is a magnified view of a portion of the multiple intersecting plate structure shown in FIG. 4B, illustrating the solid source coated plates that form the multiple intersecting plate structure.

FIG. 6A is a perspective view of a bundle of solid source coated tubes, in accordance with another embodiment.

FIG. 6B is a perspective view of a vessel employing the bundle of solid source coated tubes of FIG. 6A.

FIG. 6C is a magnified perspective view of a few of the solid source coated tubes shown in FIG. 6A.

FIG. 7A is a perspective view of a vessel holding a coiled continuous tube having an interior solid source coating, in accordance with another embodiment.

FIG. 7B is a perspective view of an alternate arrangement of the embodiment shown in FIG. 7A, the alternate arrangement lacking a vessel.

FIG. 8A is a side cross-section of a vessel employing a helical flow guide within a continuous bed of solid source powder in accordance with another embodiment.

FIG. 8B is a top cross-section taken along lines 8B—8B in FIG. 8A.

FIG. 20A is a schematic perspective top and front view of a lower stacking tray having a secondary partial divider, in accordance with an embodiment of the present invention.

FIG. 20B is a perspective schematic perspective top and front view of an upper stacking tray having a secondary partial divider for use with the lower stacking tray shown in FIG. 20A.

DETAILED DESCRIPTION OF THE PREFERRED EMBODIMENTS

Figure 1:
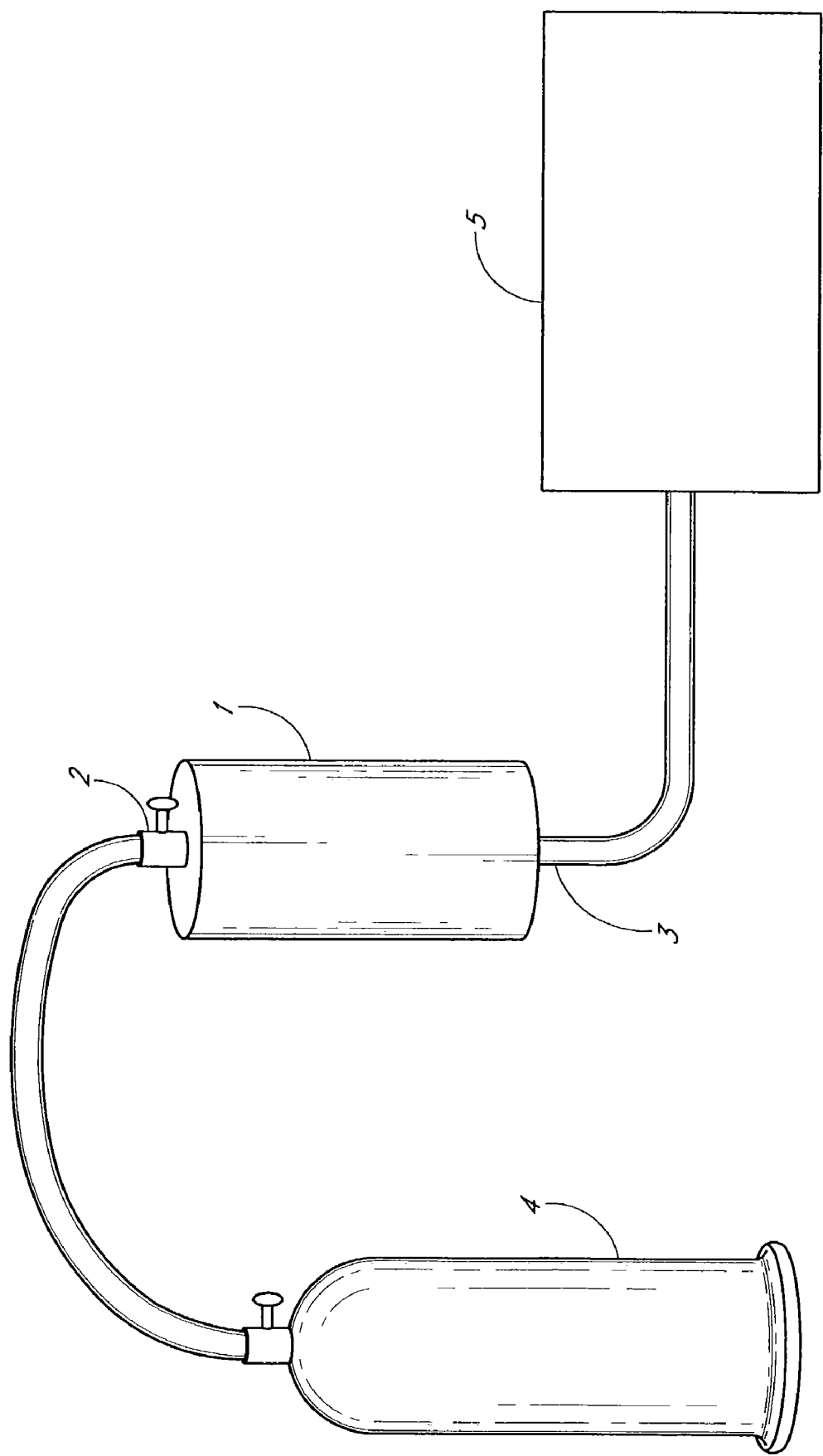
FIG. 1 is a schematic view of a substrate processing system having a vessel located between a carrier gas source and a deposition chamber.

There are several vapor deposition methods for growing thin films on the surface of substrates. These methods include vacuum evaporation deposition, Molecular Beam Epitaxy (MBE), variants of chemical vapor deposition (CVD) (including low-pressure and organometallic CVD and plasma-enhanced CVD), and atomic layer epitaxy (ALE), which is more recently referred to as atomic layer deposition (ALD).

ALE or ALD is a deposition method that is based on the sequential introduction of precursor species (e.g., a first precursor and a second precursor) to a substrate, which is located within a reaction or processing chamber. The growth mechanism relies on the adsorption of one precursor on active sites of the substrate. Conditions are such that no more than a monolayer forms in one pulse so that the process is self-terminating or saturative. For example, the first precursor can include ligands that remain on the adsorbed species, which prevents further adsorption of the first precursor. Temperatures are maintained above precursor condensation temperatures and below thermal decomposition temperatures such that the first precursor chemisorbs on the substrate(s) largely intact. This initial step of adsorption is typically followed by a first evacuation or purging stage wherein the excess first precursor and possible reaction byproducts are removed from the reaction chamber. The second precursor is then introduced into the reaction chamber. The second precursor can react with the adsorbed species, thereby producing a monolayer of the desired thin film. For example, the second precursor can replace the terminating ligands of the previously adsorbed species in a ligand exchange process. In another arrangement, an intermediate reactant can strip the ligands of the previously adsorbed species, allowing the next reactant to directly react with or absorb upon the remaining monolayer. This growth terminates once the entire amount of the adsorbed first precursor has been consumed. The excess of second precursor and possible reaction byproducts are then removed by a second evacuation or purge stage. The cycle can be repeated to grow the film to a desired thickness. Cycles can also be more complex. For example, the cycles can include three or more reactant pulses separated by purge and/or evacuation steps for producing binary, ternary, quaternary, etc. compounds.

ALE and ALD methods are described, for example, in Finnish patent publications 52,359 and 57,975 and in U.S. Pat. Nos. 4,058,430 and 4,389,973, which are herein incorporated by reference. Apparatuses suited to implement these methods are disclosed in, for example, U.S. Pat. No. 5,855, 680, Finnish Patent No. 100,409, Material Science Report 4(7) (1989), p. 261, and Tyhjiötekniikka (Finnish publication for vacuum techniques), ISBN 951-794-422-5, pp. 253–261, which are incorporated herein by reference. ASM Microchemistry Oy, Espoo, Finland, supplies such equipment for the ALD process under the trade name ALCVD™. ASM America also supplies such ALD equipment under the trade name Pulsar®.

In some ALD reactors, some or all of the precursors may be initially stored in a container in a solid state. Within the container, the precursor is heated to convert the solid precursor to a gaseous or vapor state. Typically, a carrier gas is used to transport the vaporized precursor to the reactor. The carrier gas is usually an inert gas (e.g., nitrogen), which can be the same gas that is used for purging stages.

The aforementioned problems involving existing sublimation apparatuses, including tunneling and inadequate solid/gas contact, are exacerbated by non-steady state substrate fabrication conditions, such as those used in atomic layer deposition ("ALD"), where great importance is placed on the ability of a sublimation apparatus to repeatedly and precisely meter and deliver substantially saturated or at least predictable precursor content in each pulsed flow. In other words, ALD reactors desirably expose the substrate for a brief period of time to a vapor of known, controlled, and reproducible concentration over the life of each pulse.

In one particular embodiment employing ALD, carrier gas flow is pulsed at a regular frequency through the vessel, by allowing carrier flow through, then isolating the vessel volume. The non-steady state conditions inherent in the pulsed carrier gas flow result in particular problems if conventional sublimation apparatus designs are employed. For example, when the absolute gas flow through a solid source sublimation bed, is not actively controlled, but is rather dependent on the relative resistance of two or more alternative paths, the gas flow will vary with the changing shape of the sublimation bed and resulting change in flow resistance. This fluctuation in absolute gas flow through the sublimation bed can result in varying precursor content per pulse and consequent non-uniform deposition of deposited layers upon a wafer, thus resulting in a faulty wafer. For example, as noted above, sublimation beds that are formed from vessels that are simply filled with only a precursor solid material, such as a powder, can suffer from channeling or "tunneling." Tunneling results in a decrease in carrier gas saturation through a reduction in the solid source surface area that the carrier gas contacts as the bed is consumed. The resistance of the bed can also vary with time when only a precursor solid material is used to form a bed, as the bed shrinks or individual precursor grains change shape over time.

A high "surface area" with respect to a support medium surface upon which solid source material is coated, refers to a support medium having a high ratio of total coated exposed surface area to vessel void volume, relative to a free liquid surface were it in the same vessel.

"Flowable support elements" refers to elements that can be coated with solid precursor and poured into or out of a vessel, such as beads, cylinders, filaments, or rings, etc. Each flowable support element preferably nominal size of less than about ⅛ the column diameter (e.g., width) to prevent tunneling and ensure adequate lateral mixing.

A "fixed medium" is a medium that is not flowable and is meant to remain stationary during processing.

A "carrier gas contact pathway" is a route which a carrier gas generally follows through a solid source apparatus, the route placing the carrier gas in substantial contact with a solid source material surface.

Referring to FIG. 1, an embodiment of the present invention is shown employing a substrate processing system comprising a sublimation apparatus, having a vessel 1 located inline between a carrier gas source 4 and a vapor deposition chamber 5. The illustrated deposition chamber 5 can be a chemical vapor deposition (CVD) chamber, but preferably is an atomic layer deposition (ALD) chamber, which includes a pulsing mechanism (not shown) comprising pulsing valves, tubing, gas sources, and appropriate control circuitry or software. An ALD chamber is preferably configured for alternating, self-limiting pulses of process vapors that leave less than or equal to one monolayer per pulse. Preferably, separate inlet paths are provided for each reactant, to minimize risk of mixing and consequent CVD-type reactions. The sublimation vessel 1 is joined to the carrier gas source 4 by a gas line connected to an inlet port 2 of the vessel 1, while the deposition chamber 5 is joined to the sublimation vessel 1 by a gas line connected to an outlet port 3 of the vessel 1.

In alternate embodiments, no carrier gas is employed to carry the vapor reactant to the chamber. Instead, in these embodiments, the undiluted vapor reactant is flowed to the processing chamber by convective flow caused by the pressure differential between vapor pressure and reactor pressure. The skilled artisan would understand that, in alternate embodiments described herein, references to transferring the vapor reactant via "flow" or "carrier gas flow" can be caused by the change in pressure ($\Delta P$) of the carrier gas or the chemical-reactor pressure differential. In either case, the flow out of the solid source vessel is preferably substantially saturated at the pulsing conditions typical of ALD (i.e., pulse duration on the order of 0.1–1.0 seconds, cycle duration on the order of 1 sec. to 1 min).

In yet other alternate arrangements, additional gases are added to the carrier gas and vapor reactant mixture prior to outputting the resulting diluted mixture. Preferably such dilution takes place between the vessel outlet port 3 and the deposition chamber 5. Note that reactions other than deposition (e.g., etching, gettering, etc.) can take place in the downstream reaction chamber, depending on the application for the vapor phase reactant.

Referring now to FIG. 2A, an embodiment of a sublimation apparatus 29 of a semiconductor processing system is shown employing a coated support medium as a guidance structure. In the illustrated embodiment, the support medium is formed from "flowable" support elements comprising beads 6 which are packed into the sublimation vessel 1. Preferably, these beads are configured to provide tortuous pathways for a carrier gas. The inlet port 2 is configured as an entrance for carrier gas while the outlet port 3 is configured as an exit for carrier gas having passed through the beads 6. The sublimation vessel 1 also preferably has a fill port 8 in order to facilitate the replacement of the support elements. Preferably, the inlet port 2 and the outlet port 3 define a primary axis of the sublimation vessel 1. In the illustrated embodiment, the sublimation vessel 1 is a cylinder with the inlet port 2 located at one end of the cylinder and outlet port 3 located at the opposite end, although the skilled artisan will appreciate that the vessel can take any suitable shape. In addition, the vessel 1 also preferably has a heater 26 in order to affect and control the vaporization of the solid source coating 7 (FIG. 2C) on the beads 6, such as the illustrated resistive heating elements surrounding the vessel 1. The vessel 1 also preferably includes distribution manifolds (not shown) at the inlet 2 and outlet 3 of the sublimation vessel, the manifold being configured distribute to carrier gas more evenly across the vessel for uniform contact with the coated support medium. While illustrated herein as heating elements within walls of the vessel, heating can take any of a number of forms. In one embodiment, the vessel is radiantly heated within a vacuum chamber. Greater detail of this radiant heating system can be found in U.S. application Ser. No. 09/854,706, filed May 14, 2001, the disclosure of which is incorporated by reference in its entirety.

FIG. 2B is a magnified view of a portion of the sublimation vessel 1 shown in FIG. 2A. Beads 6 are configured and packed in order to provide a high number of potential gas contact pathways 9 for the carrier gas, ensuring that the carrier gas contacts a large surface area of solid source coating and, thus, is more likely to become saturated with vapor reactant as it traverses the bed in a pulsed flow fashion. One of ordinary skill would realize that an infinitely long pulse constitutes continuous flow through the vessel.

As shown in FIG. 2C, each support element, here bead 6, is coated with the solid source for vapor reactant coating 7. Preferably, the width or diameter D of the bead 6 is substantially larger than the thickness C of the solid source coating 7, in order to ensure that the shape of the coated support elements, and thus the total flow resistance of the sublimation bed, preferably does not fluctuate greatly over time as the coating 7 is eroded. At the same time, the volume of each support element should not be so great that the high total surface area of the support medium formed by the support element is sacrificed. Preferably, the ratio (C/D) of coating thickness C to bead diameter D is between 0.01 and 0.30, more preferably between 0.05 and 0.15. The bead volume depends on total vessel volume. For example, when bead volume and particle volume are considered as a fraction of the total vessel volume, for a large sized vessel (12 inch diameter by 12 inches high), a preferred maximum for number of particles is 10,000, a minimum of ~100. This preferred ratio equates to $5 \times 10^{-5} < V_{bead}/V_{bed} < 0.01$ and more preferably between 0.0002 and 0.005.

The beads 6 preferably comprise a substance which is both inert, such as alumina ($Al_2O_3$) or fused silica, and is preferably also thermally conductive, such as stainless steel, hastelloy, nickel, boron nitride (BN) and other suitable substances. Most preferably, the support elements comprise silicon carbide (SiC), which is chemically inert and conductive.

FIG. 2D illustrates an alternate arrangement of the sublimation vessel shown in FIG. 2A. A magnified view of a sublimation bed is shown employing cylinders 10, rather than beads, coated with the solid source coating 7. This configuration of packed cylinders 10 also creates a multitude of potential gas contact pathways 9 in order to ensure that the carrier gas contacts a large surface area of solid source coating as it traverses the bed in a pulsed flow fashion. One of ordinary skill would realize that an infinitely long pulse constitutes continuous flow through the vessel.

In additional alternate arrangements, the coated flowable support elements 6 shown in FIG. 2A are in the form of pellets, spheres, filaments, or rings. The chemical catalyst industry uses flowable support elements having similar geometry (beads, pellets, spheres, rings, etc), each being coated with a catalytic material, which would also provide appropriate geometric support element configurations in order to practice alternate arrangements of the preferred embodiments provided herein. Preferably, these support media are arranged to provide non-linear contact paths for the carrier gas. These support elements can include both porous and nonporous structures. In arrangements that employ porous support elements, the pores are preferably macropores, which are less likely to become completely filled with condensed solid source material when coated.

Referring now to FIG. 3A, an embodiment of the present invention is shown employing, in a sublimation apparatus 29, a fixed coated support medium in the form of a solid source coated filter 11 contained within a sublimation vessel 1. Preferably, the filter 11 is configured to substantially fill the sublimation vessel 1 while still enabling the efficient replacement of the filter 11 when the solid source for vapor reactant coating is sufficiently exhausted. FIG. 3B shows a partial cross-section of the vessel 1, while FIG. 3C shows a magnified cross-section of the filter 11 shown in FIG. 3B. The filter 11 is preferably formed by filter fibers 12, each filter fiber 12 being coated with a solid source for vapor reactant (or solid precursor) 7 to provide both increased surface area and a multitude of potential gas contact pathways 9 in order to ensure the saturation of the carrier gas with vapor reactant. The ratio of fiber width to coating thickness preferably falls within the ranges discussed below with respect to flowable support elements. In addition, the vessel 1 also preferably has a heater 26 in order to control the vaporization of the solid source coating 7.

FIG. 4A shows an embodiment of the present invention employing in a sublimation apparatus 29, a coated fixed support medium in the form of a multiple intersecting plate structure 13, each plate 14 being coated with a solid source for vapor reactant. Preferably, the multiple intersecting plates structure 13 are located within the sublimation vessel 1 in such a way as to substantially fill the internal volume of sublimation vessel 1. FIG. 4B shows a partial cross-section of the layout of individual plates 14 employed in FIG. 4A. Preferably, the plates 14 are configured to provide parallel tunnels 24 having both substantially equal surface area and resistance relative to one another in order to decrease the likelihood of incomplete saturation of the carrier gas at the outlet 3 (see FIG. 4C and discussion). Each parallel tunnel 24 formed by the plates 14 shown in FIGS. 4A and 4B represents a discrete carrier gas contact pathway, which extends the length (see FIG. 4A) of the multiple intersecting plate structure 13. In addition, the vessel 1 also preferably has a heater 26 in order to both increase and control the vaporization of the solid source coating 7.

Alternate arrangements of the interlocking plate structure shown in FIG. 4A do not make use of a pattern of plates 14 which are perpendicularly intersecting but rather employ plate intersections greater or less than 90 degrees, such as triangular overlap patterns.

FIG. 4C is a magnified view of a portion of the multiple intersecting plate structure shown in FIG. 4B in order to better illustrate the solid source coating 7 adhered to the surface of the plates 14. As noted, the interlocking plates are preferably configured to provide discrete parallel tunnels 24, which are sufficiently narrow to ensure the carrier gas closely contacts a surface coated with solid source for vapor reactant. In preferred embodiments, the plates 14 are coated with solid source material, such as by condensation from exposure to a vapor saturated with solid source, and the plates 14 are formed from quartz.

In alternate arrangements, in order to provide the carrier gas with a more convoluted flow contact pathway, the potential gas flow contact pathways formed by the plates may be non-linear through such modifications as a nonparallel arrangement (e.g., offset or staggered) of the plates or through holes placed in the face of the plates. In certain arrangements, the plates are constructed from generally porous materials.

Figure 5C:
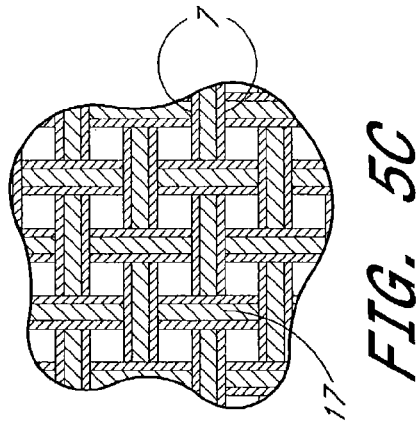
FIG. 5C is a magnified view of a portion of the screen shown in FIG. 5B, illustrating the solid source coated screen members that form the screen.
Figure 5A:
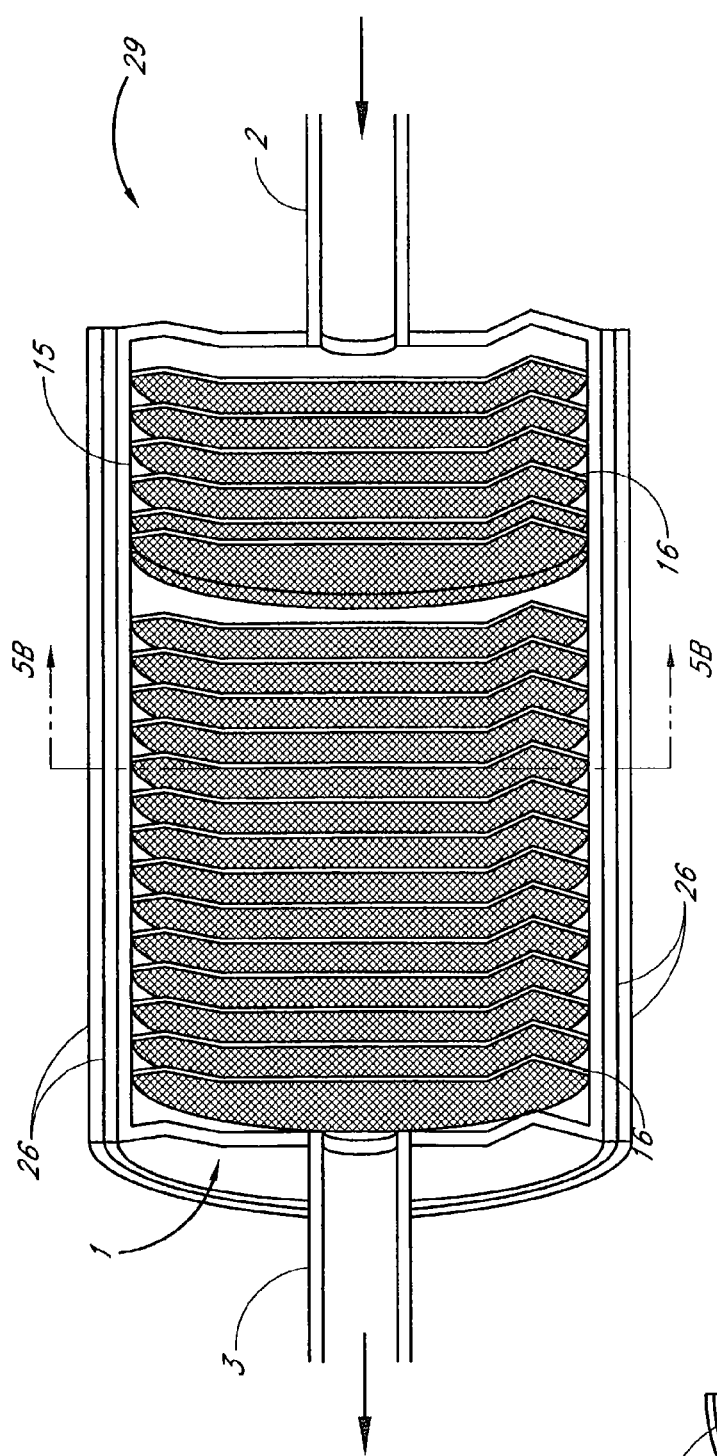
FIG. 5A is an isometric cutaway view of a vessel holding a screen cartridge having a plurality of solid source coated screens in accordance with another embodiment.

Referring now to FIG. 5A, an embodiment of the present invention is shown employing in a sublimation apparatus 29, a coated support medium in the form of a screen cartridge 15 located in a vessel 1. The screen cartridge 15 is preferably comprised of multiple screens 16, which are preferably stacked perpendicular to the main carrier gas flow path. Each individual screen 16 is preferably removable, and the vessel is provided with one or more sealable doors or hatches (not shown) for this purpose, thus allowing upstream screens on which the solid source of vapor reactant has been exhausted to be removed and replaced while downstream, unexhausted screens 16 may be left in place during maintenance or refill operations. In addition, the vessel 1 also preferably has a heater 26 (shown in the walls of the vessel 1) in order to both increase and control the vaporization of the solid source coating 7 (FIG. 5B).

Figure 5B:
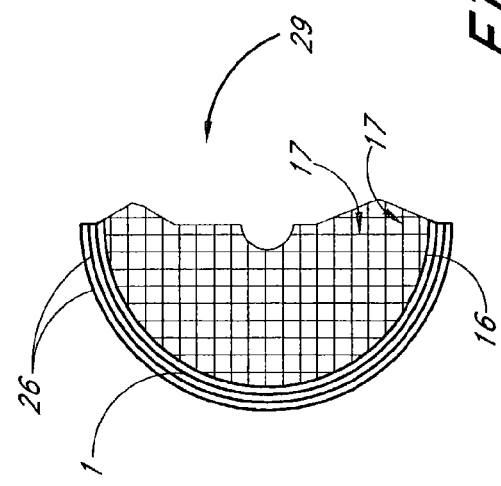
FIG. 5B is a cross-section taken along lines 5B—5B in FIG. 5A.

FIG. 5B illustrates a cross-section of the screen 16 shown in FIG. 5A. Each screen 16 is comprised of screen fibers 17. The magnified view shown in FIG. 5C represents a portion of the screen 16 shown in FIG. 5B in order to illustrate the solid source coating 7 which is adhered to the individual screen fibers 17. Preferably, the screen fibers 17 are arranged in a uniform overlapping pattern, such as weaving the screen fibers 17 together as shown in FIG. 5C.

FIG. 6A illustrates yet another embodiment of the present invention employing a coated fixed support medium as a gas flow guidance structure forming generally parallel discrete gas contact pathways, here formed by tubes 19. The tubes 19 are preferably arranged in a tube bundle 18 and located in a sublimation vessel 1, as shown in FIG. 6B. Preferably, the vessel 1 is provided with a manifold (not shown) to direct gas from the narrow inlet 2 and evenly distribute through all of the tubes 19, and similarly to collect and funnel gas at the outlet 3. The skilled artisan will appreciate that such manifolds (not shown) can improve gas flow distribution across the vessel in any of the embodiments described herein. In addition, the vessel 1 also preferably has a heater 26 in order to both increase and control the vaporization of the solid source coating 7 (FIG. 6C). FIG. 6C shows a magnified perspective view of the tubes 19 forming the tube bundle 18 in both FIGS. 6A and 6B in order to illustrate the solid source coating 7 on the interior of tubes 19.

Referring to FIG. 7A, an embodiment of the present invention is shown employing a fixed support medium as a gas flow guidance structure, here a coiled tube 20. The coiled tube 20 is joined to both an inlet port 2 and an outlet port 3, preferably inside a sublimation vessel 1. The coiled tube 20 is preferably configured to be tightly coiled in order to maximize the length of the unitary solid source coated contact pathway (not shown) which the carrier gas contacts as it travels through the coiled tube 20. In addition, the vessel 1 also preferably has a heater 26 in order to control the vaporization of the solid source coating 7. In alternate embodiments, the coiled tube 20 is not contained within a sublimation vessel 1 as shown in FIG. 7B, but preferably still is configured to have a heater 26.

Figure 7C:
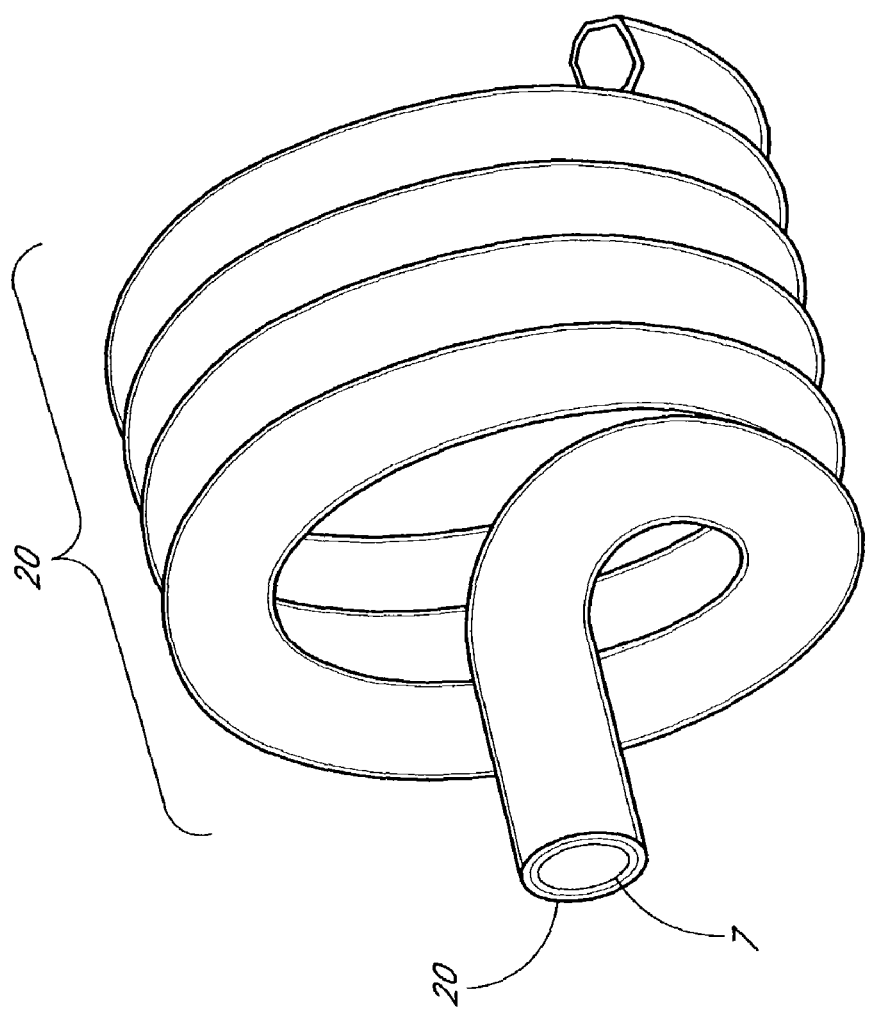
FIG. 7C is a magnified perspective view of the coiled tube shown in FIGS. 7A and 7B, the tube having an interior solid source coating.

FIG. 7C shows a magnified view of the coiled tube employed in FIGS. 7A and 7B. The interior of the coiled tube 20 is coated with solid source coating 7, preferably uniformly throughout the entire length of the coiled tube 20.

The coiled tube 20 is preferably designed so that, as the solid is consumed from inlet to outlet over time, at carrier gas flows typical of ALD (e.g. 50–5000 sccm carrier and chemical or 5–500 sccm of pure chemical flow), the gas (with or without carrier) stream is substantially saturated (e.g., >95% of chemical saturation vapor pressure at the given temperature) after traveling less than or equal to only approximately 20% of the overall tubing length. This allows the vessel to have the equivalent of 5 residence times, which, for PFRs, many dispersion model reactors or laminar flow reactors allows greater than 95% conversion/saturation. In order to avoid damaging the interior solid source coating 7 as a result of bending the support medium, the coiled tube 20 is preferably configured to precisely fit within a sublimation vessel 1. In one particular embodiment, the coiled tube is coated with hafnium chloride ($HfCl_4$) through evaporation and condensation techniques. In one example, the interior diameter of each coiled tube 20 is between about 0.25 inch to about 2 inches, with the coating thickness being between about 0.025 and about 0.25. Preferably, the overall effective length of the tube is chosen such that the residence time of the vessel flow is preferably greater 5 if continuously flowing for greater than the selected pulse time for the pulsed flow operation.—The absolute length is dependent on such factors as chemical sublimation rate, gas flow rate, vessel pressure, reactor pressure, vessel temperature, etc. In certain preferred embodiments sublimation vessels are designed in view of these factors to effectuate the substantial saturation of the carrier gas under ALD conditions.

Although the present invention is particularly well suited as a semiconductor processing system for the processing of semiconductor wafers, it should be understood that the present invention has applicability with regard to substrate processing systems for the processing of a wide variety of substrates, as would be understood by the skilled artisan.

Embodiments of the present invention employing gas flow guidance structures having a coating of solid source material may have these solid source coatings formed through a variety of processes such as, among other techniques, sublimation and condensation technology, static powder coating, solvent evaporation, CVD, ALD and other techniques known to those skilled in the art. In one arrangement, the solid source coating is zirconium chloride (ZrCl$_4$), while in an alternate arrangement the solid source coating is hafnium chloride (HfCl$_4$). Tubes for use in certain preferred embodiments may also be coated through atomic layer deposition (ALD) of the solid source for vapor reactant directly on the interior walls of the tube itself as disclosed in WO 99/229924, published Jan. 17, 1999, which is hereby incorporated by reference for this purpose.

Preferred embodiments also employ a solid source coated guidance structure comprised of a substance which is inert, such as aluminum oxide (Al$_2$O$_3$) or alumina, and silicon dioxide (SiO$_2$), and thermally conductive such as, among others, silicon carbide (SiC).

In embodiments employing a support medium having a solid source coating, the ratio of the coating surface exposed to carrier gas to the volume occupied by the coated support medium will typically vary with the embodiment. For example, and without limitation, this ratio is preferably greater than about 1 cm$^{-1}$ for the embodiment of FIG. 6A, more preferably greater than about 2 cm$^{-1}$. The ratio is preferably greater than about 5 cm$^{-1}$ for the embodiment of FIG. 3A, more preferably greater than about 10 cm$^{-1}$. The ratio is preferably greater than about 0.1 cm$^{-1}$ for the embodiment of FIG. 7A, more preferably greater than about 0.2 cm$^{-1}$.

In alternate preferred embodiments, the ratio of the coating thickness and the size of the opening formed by the coated support medium are important considerations in increasing solid precursor surface area and lengthening the carrier gas contact pathway in order to substantially saturate each carrier gas pulse. For example, in embodiments employing a coated tube or a bundle of tubes, the ratio of the thickness of the coating and coated tube opening diameter is preferably between about 0.01 and about 0.30, more preferably between about 0.05 and about 0.15. In certain preferred embodiments employing the coated plates, the ratio of the width of opening formed by the intersecting coated plates and the thickness of the coating is preferably between about 0.01 and about 0.30, more preferably between about 0.05 and about 0.3. In preferred embodiments employing intersecting coated fibers, the important ratios are the aforementioned ratios for flowable elements.

Embodiments employing a fixed medium coated with solid source material are preferably designed to fit closely in a sublimation vessel, in order to prevent the potential damage to the solid source coating caused by bending the fixed medium while inserting the fixed medium into a sublimation vessel.

FIG. 8A illustrates an embodiment of the sublimation apparatus 29 employing a flow guide 22 as a gas flow guidance structure in a substrate fabrication system. Similar to conventional arrangements, the sublimation vessel 1 has a single continuous layer, or bed, of solid source material 21, preferably in the form of a powdered solid source compound. The flow guide 22 preferably guides the carrier gas in a tortuous contact pathway in contact with the solid source material 21, such as gas flow contact pathway 9. Preferably, the flow guide 22 extends most of the way from the floor to ceiling of vessel 1, more preferably all the way. The carrier gas enters the sublimation vessel at inlet port 2 on a solid source contact pathway which is substantially greater than the direct distance between inlet port 2 and the outlet port 3, represented by reference line E, preferably at least twice the length of the direct distance. Reference line E illustrates an undesirable solid source/gas contact pathway which a carrier gas could travel absent the flow guide 22, the undesirable contact pathway offering the carrier gas poor total solid source surface area contact. In addition, the vessel 1 also preferably has a heater 26 in order to control vaporization of the powdered solid source 21. While illustrated as within the walls of vessel 1, the heater is more preferably a radiant heater within a low pressure chamber that also houses the vessel 1.

FIG. 8B shows a cross-section of the embodiment shown in FIG. 8A. The flow guide 22 preferably provides a carrier gas flow contact pathway which is both unitary and tortuous, such as the spiral contact pathway 9 shown here. The flow guide 22 increases the solid source surface area that the carrier gas closely contacts by preventing the carrier gas from moving directly between the inlet port 2 and the outlet port 3. Such direct flow would cause the carrier gas to only come into contact with vapor reactant originating from the surface of the powdered solid source material located proximate to reference line E. The illustrated embodiment provides an elongated carrier gas pathway and increases residence time within the vessel 1, while maintaining the simplicity of a single bed in order to ease the replacement of the powdered solid source 21. Advantageously, the illustrated flow guide 22 is removable, which allows for an existing sublimation vessel to be retrofitted with minimal effort and cost.

Figure 9:
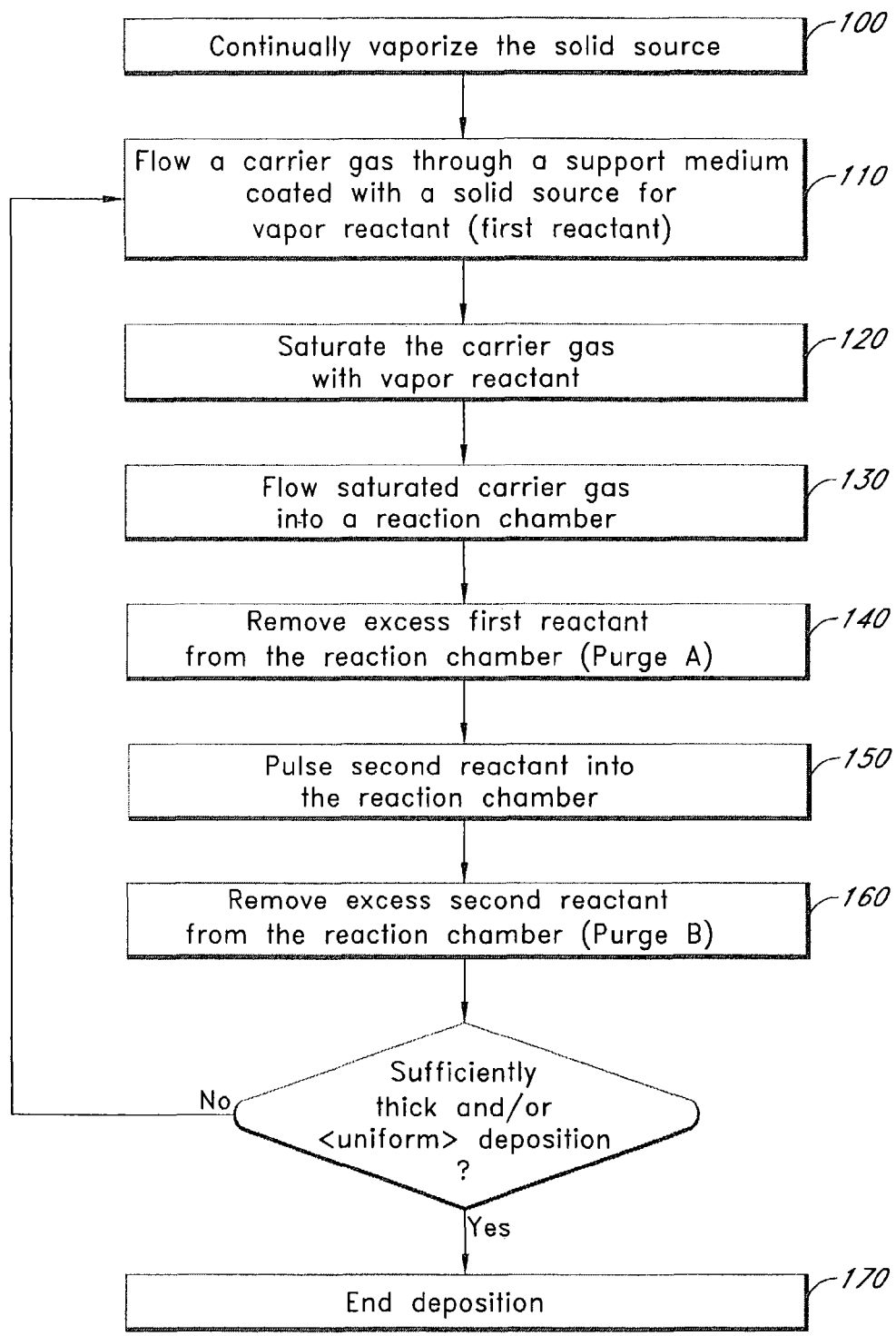
FIG. 9 is a flowchart of a method of using a solid source for vapor reactant, in accordance with preferred embodiments of the invention.

FIG. 9 shows a method of employing the structures provided herein, including saturating a carrier gas with vapor reactant originating from a solid source material. A solid source for vapor reactant is vaporized 100, preferably by continuous heating of the solid source material. The solid source material is preferably vaporized by heating the solid source material to effect a vapor pressure of the solid between 0.1 and 100 Torr. For HfCl$_4$, this would roughly equate to a temperature range between 140° C. to 265° C. A carrier gas is flowed 110 through a support medium having a coating of a solid source for a vapor reactant (first reactant). The carrier gas is substantially saturated 120 with a first vaporized reactant as it flows through the solid source coated support medium. Preferably, the carrier gas is guided during its transit (e.g., during continuous flow or pulsing) to contact a sufficiently high surface area of solid source material in order to saturate the carrier gas with reactant vapor from the solid source. The saturated vapor is then flowed 130 into a reaction chamber where a self-limited, saturative reaction (e.g., chemisorption of no more than a monolayer) takes place. At this point, the vessel may be isolated from the carrier gas flow ( e.g., the flow from the vessel outlet is briefly halted) or the carrier gas can be diverted to a vessel bypass from the flow path through the vessel. Subsequently, the excess first reactant is removed 140 from the reaction chamber during Purge A. A second reactant is then pulsed 150 into the reaction chamber. This second reactant differs from the first reactant and preferably does not originate from the sublimation vessel from which the first reactant originated. The second reactant preferably is a reactant selected for interacting with a previously adsorbed species originating from the solid source for vapor reactant, but could also result in chemisorption of no more than a monolayer. Next, the excess second reactant is removed 160 from the reaction chamber during Purge B. If additional reactions within the reaction chamber are then desired, i.e. the deposition is not sufficiently thick, Steps 110 through 160 are then repeated until the deposition is the desired thickness is deposited. If a sufficient thickness has been deposited, the process ends 170. As noted above, though FIG. 9 gives only the examples of a two-reactant ALD process, ALD processes involving more than (or less than) two reactants are also employed in certain preferred embodiments.

FIGS. 10–17 illustrate a solid source vessel 200 in accordance with another embodiment of the invention. Advantageously, the vessel 200 can provide a greater contact area with commercially available types of solid source powder, rather than custom coated support structures. It will be understood, of course, that the vessel 200 of FIGS. 10–17 can also be employed in conjunction with the structures described herein. A winding or convoluted path is provided through a plurality of beds within a single openable structure, considerably simplifying the reloading process when recharging of the vessel 200 with fresh solid source material is required.

Figure 10:
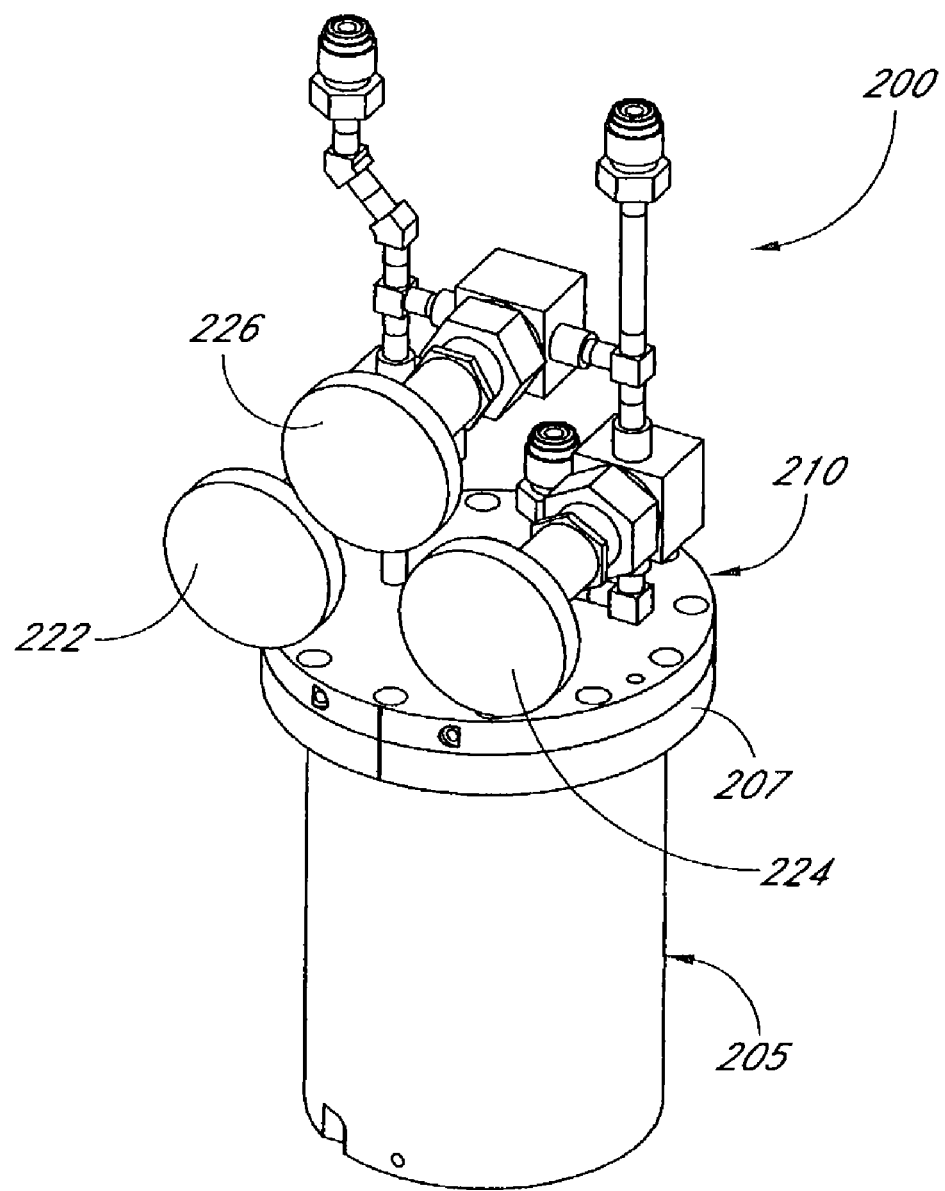
FIG. 10 is a perspective view of a solid source vessel constructed in accordance with another embodiment of the present invention.
Figure 11:
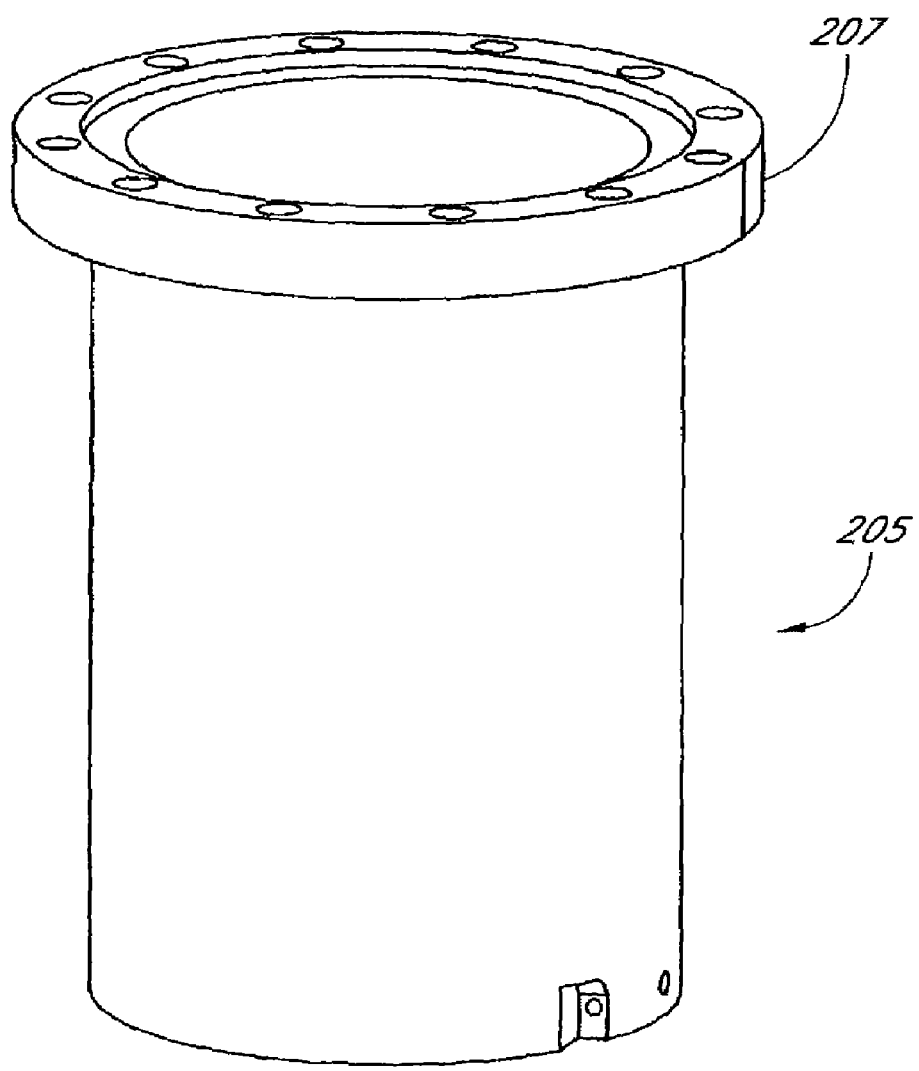
FIG. 11 is a perspective view of an external container from the vessel of FIG. 10.
Figure 12:
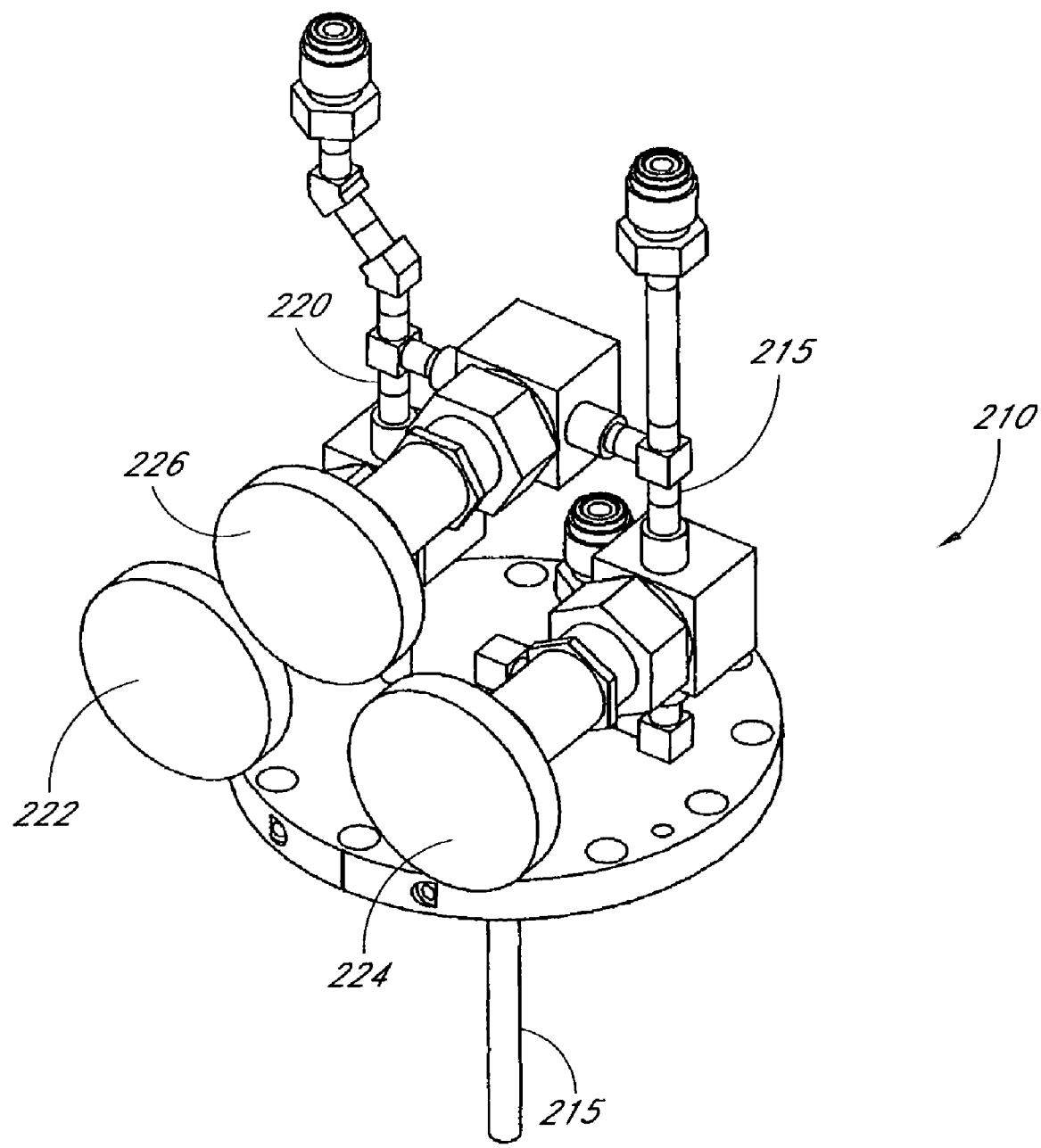
FIG. 12 is a perspective view of a lid from the vessel of FIG. 10, including a plurality of associated valves and gas tubes.
Figure 13:
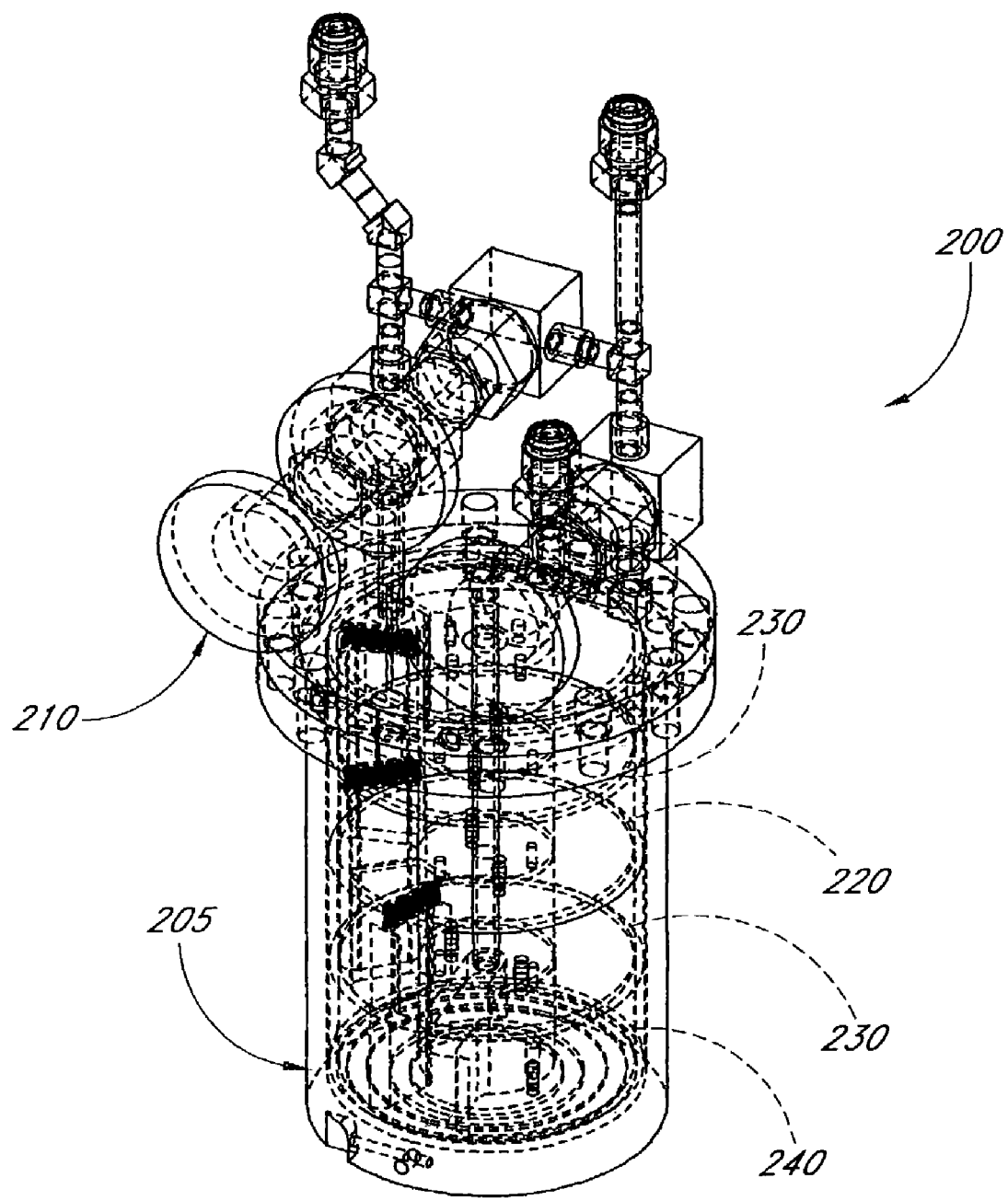
FIG. 13 is perspective view of the solid source vessel of FIG. 10, showing inner components in phantom lines.

Referring initially to FIGS. 10–12, the vessel 200 comprises an external container 205 and a lid component 210. A similar system, employing an inner container to facilitate loading or unloading of solid source material, is disclosed in co-owned Finnish application FI 20001166, filed on May 15, 2000 and corresponding U.S. publication No. 2001/0042523, published Nov. 22, 2001 (hereinafter "Kesala"), the disclosure of which is incorporated herein by reference. In the illustrated embodiment, the external container 205 includes a flange 207 configured to permit bolting of the lid 210 with the external container 205, although the skilled artisan will appreciate a variety of other methods of removably closing the lid 210 upon the container 205. The lid 210 of the illustrated embodiment is removable and includes an inlet conduit 215 and an outlet conduit 220, as well as a plurality of manual isolation valves 222, 224, 226 for use when opening the vessel 200 for maintenance or recharging. The lid is removed for charging the vessel, while the plurality of valves are used to direct flow through, from or around the vessel.

With reference now to FIGS. 13–18, instead of a single inner container or crucible for holding a single bed of solid source material, the illustrated embodiment provides a segregating, long and winding path through a plurality of solid source beds, and provides this structure within a single outer container 205. Rather than individually recharged chambers, the beds are provided in a plurality of stacking trays configured to form the segregating and winding flow path simply by their interconnection. In the illustrated embodiment, four trays are stacked: three upper trays 230 and one lower tray 240. The number of trays can vary based on parameters such as the sublimation rate, carrier flow, etc.

Figure 14:
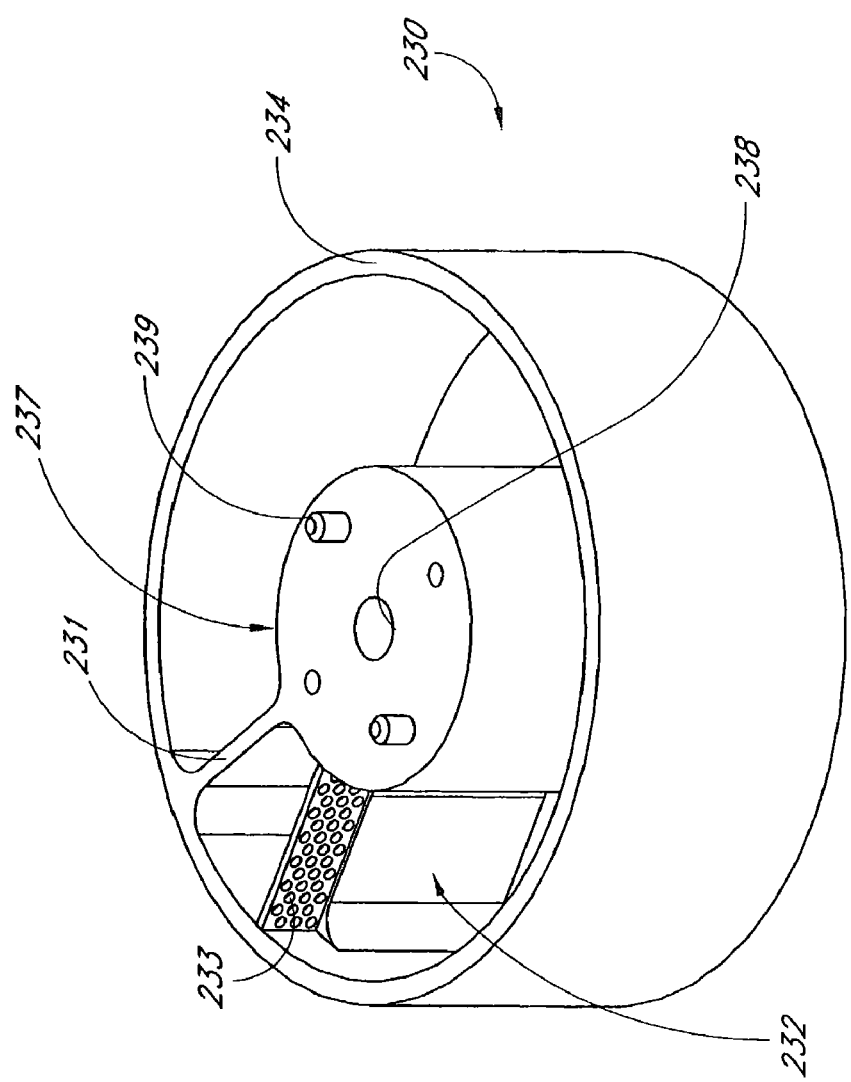
FIG. 14 is a perspective view of a lower stacking tray for use within the solid source vessel of FIG. 10.
Figure 15:
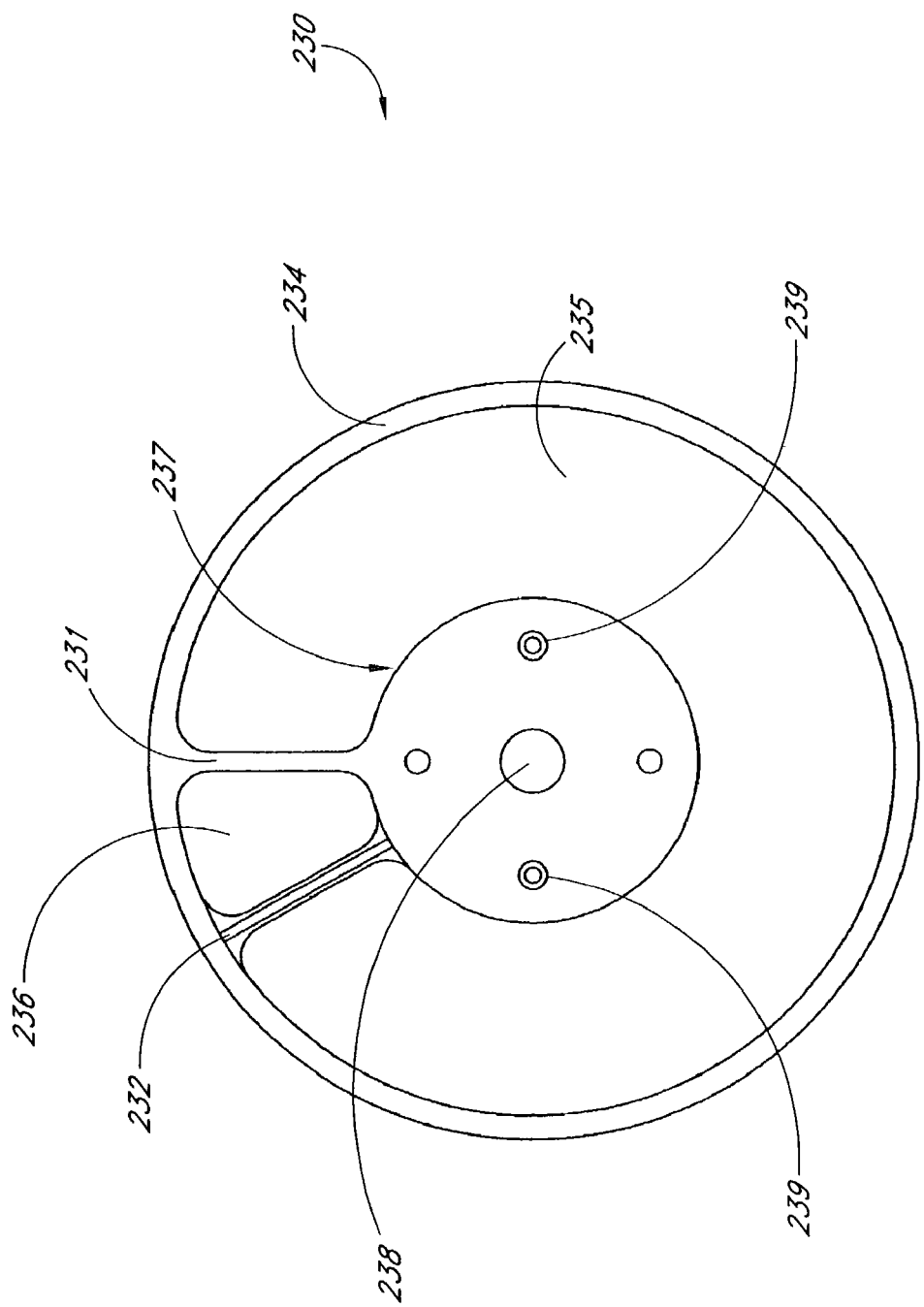
FIG. 15 is a top plan view of the lower stacking tray of FIG. 14.

Referring to FIGS. 14 and 15, each upper tray 230 includes a solid divider 231, preventing gas flow therethrough and extending the full height of the tray 230, and a partial divider 232 that allows gas flow therethrough. Preferably, the partial divider includes a screen 233 configured to retain large precursor particulates while allowing free gas flow therethrough. In the illustrated embodiment, the screen 233 extends across the top portion of the partial divider 232, while a solid panel completes the height of the partial divider 232. An annular rim 234 also extends the height of the upper tray 230. The solid divider 231 and the partial divider 232 together define a main compartment 235 for holding solid source material (not shown) and an outer channel compartment 236 that is open at the lower surface of the tray 230. The illustrated upper tray 230 also has a central core 237 that includes a central channel 238 (to accommodate the gas inlet pipe), a plurality of pegs 239 on an upper surface thereof and a corresponding plurality of holes (not shown) on a bottom surface thereof for receiving the pegs of another tray therebelow. As will be better understood in view of the operation, described hereinbelow, the holes on the lower surface of the central core 237 are desirably rotationally offset relative to the pegs 239 on the upper surface, serving to properly align the plurality of trays upon one another to define the winding flow path. In certain preferred embodiments, the corners in the main compartment to which the flow is exposed are rounded to minimize flow stagnation from sharply angled corners.

Figure 16:
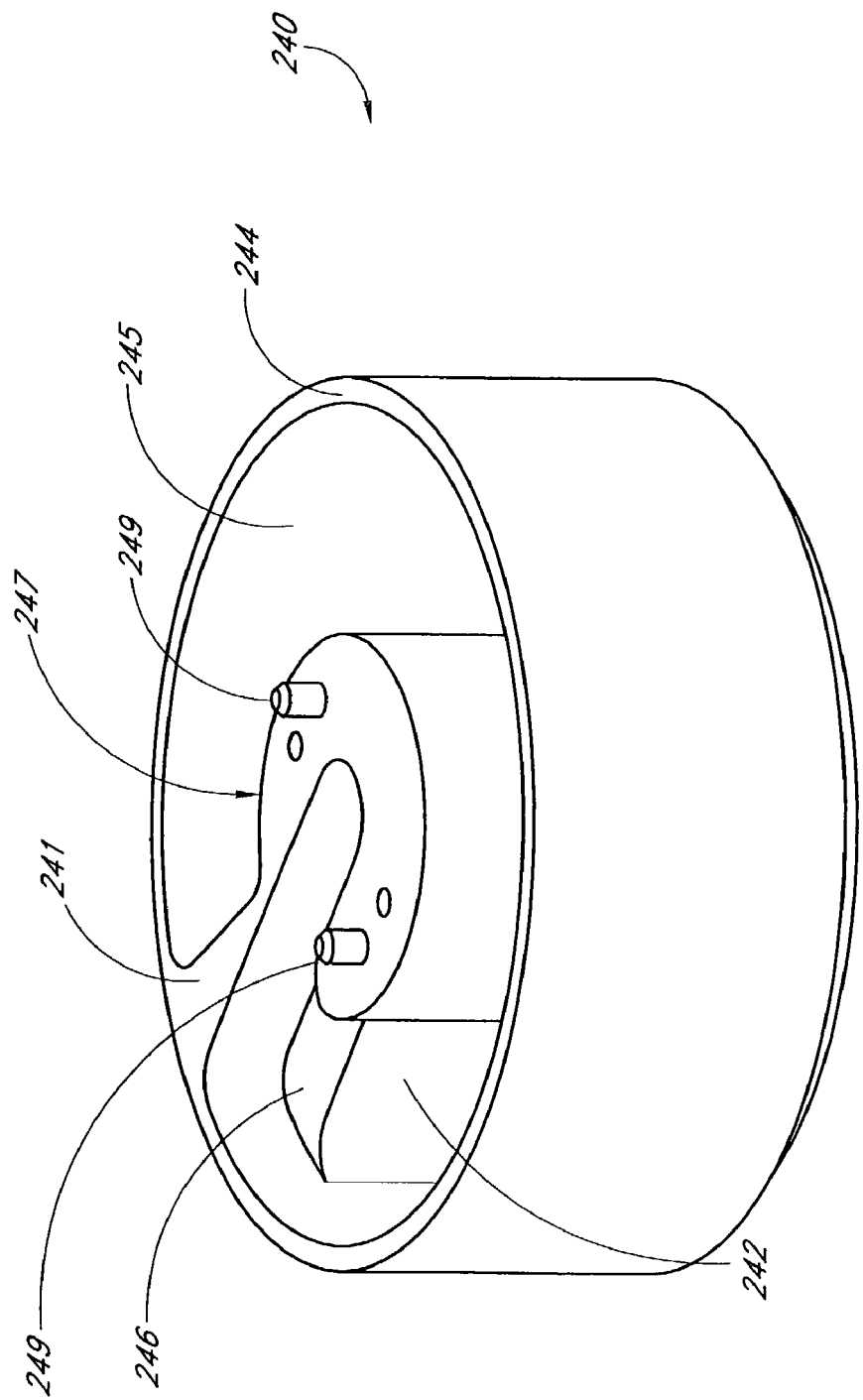
FIG. 16 is a perspective view of a lower stacking tray for use within the solid source vessel of FIG. 10.
Figure 17:
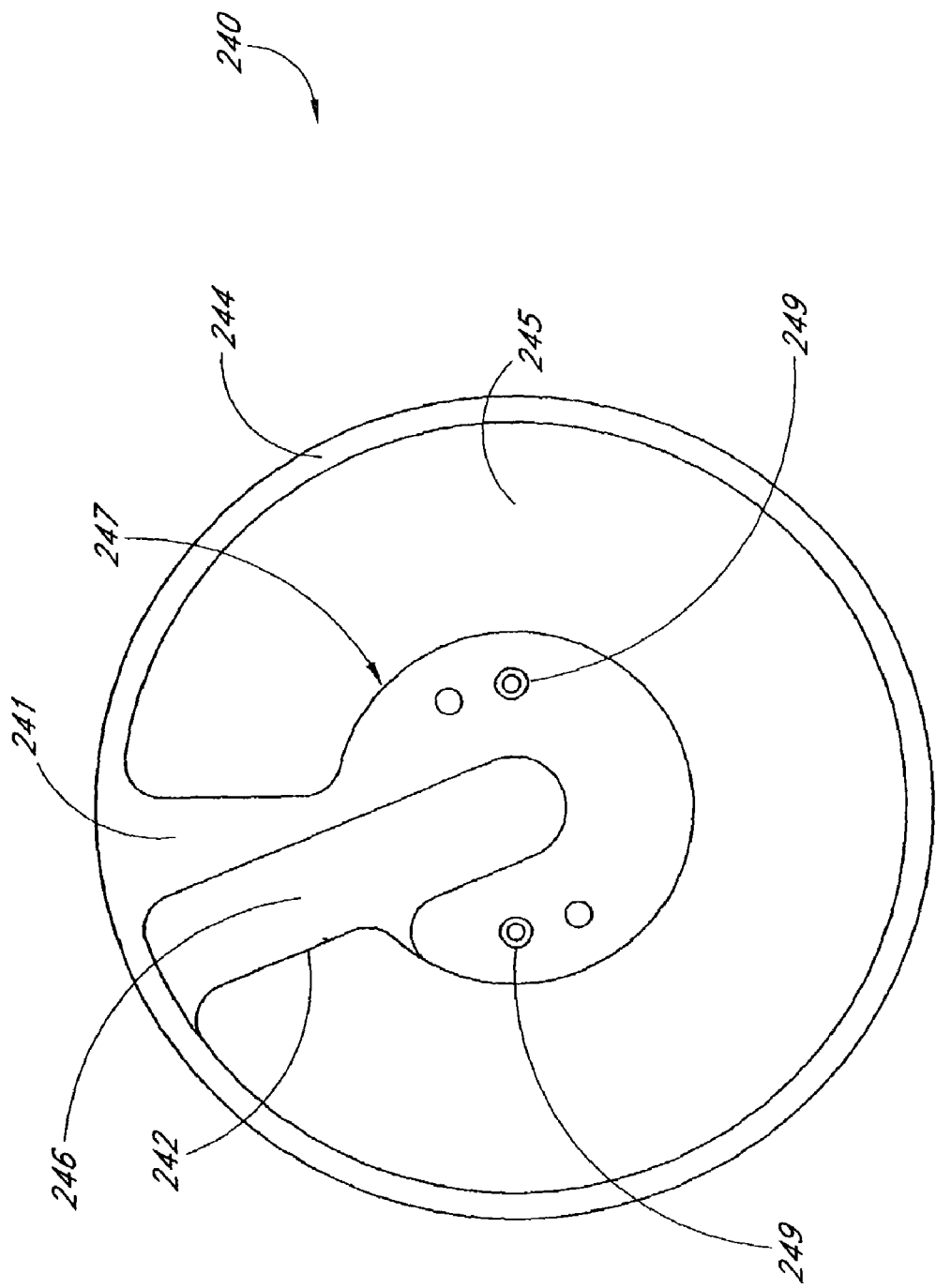
FIG. 17 is a top plan view of the lower stacking tray of FIG. 16.

Referring to FIGS. 16 and 17, the lowest tray 240 comprises a solid divider 241, preventing gas flow therethrough and extending the full height of the tray 240, and a partial divider 242 that allows gas flow thereover. Preferably, the partial divider 242 simply provides an opening to the central channel 238 in the middle of the overlying upper tray 230, as will be better understood in view of the description of FIGS. 18 and 19 below. An annular rim 244 also extends the height of the lower tray 240. The rim 244, the solid divider 241 and the partial divider 242 together define a main compartment 245 for holding solid source material (not shown) and an outer channel compartment 246. In preferred embodiments, the solid source material only fills the main compartment 245 up to and even with channel compartment 246. In alternate embodiments, the solid source material fills the between one third and two thirds of the height of the main compartment. The illustrated lower tray 240 also has a central core 247 into which the channel compartment 246 protrudes, a plurality of pegs 249 on an upper surface thereof and a corresponding plurality of holes (not shown) on a bottom surface thereof for receiving the pegs of the floor that protrude from the outer container 205 (see FIGS. 10–11).

Figure 18:
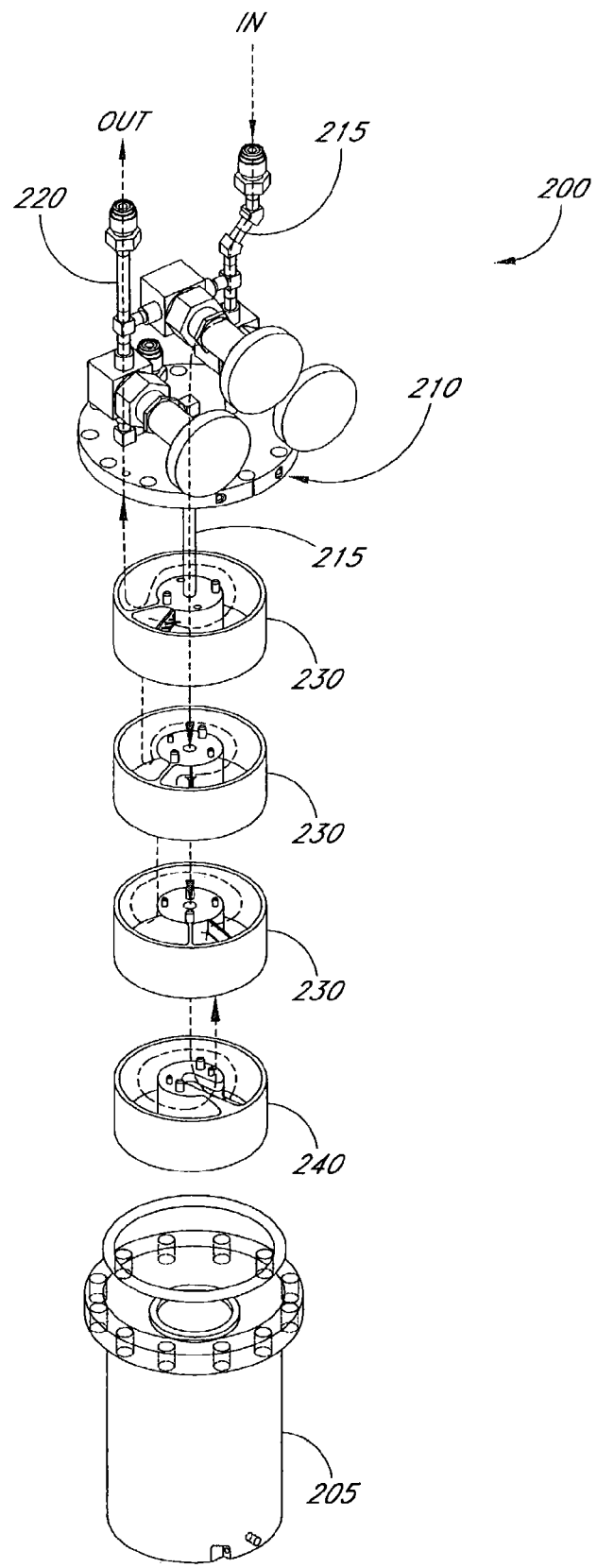
FIG. 18 is an exploded perspective view of the vessel shown in FIG. 10 during assembly.
Figure 19:
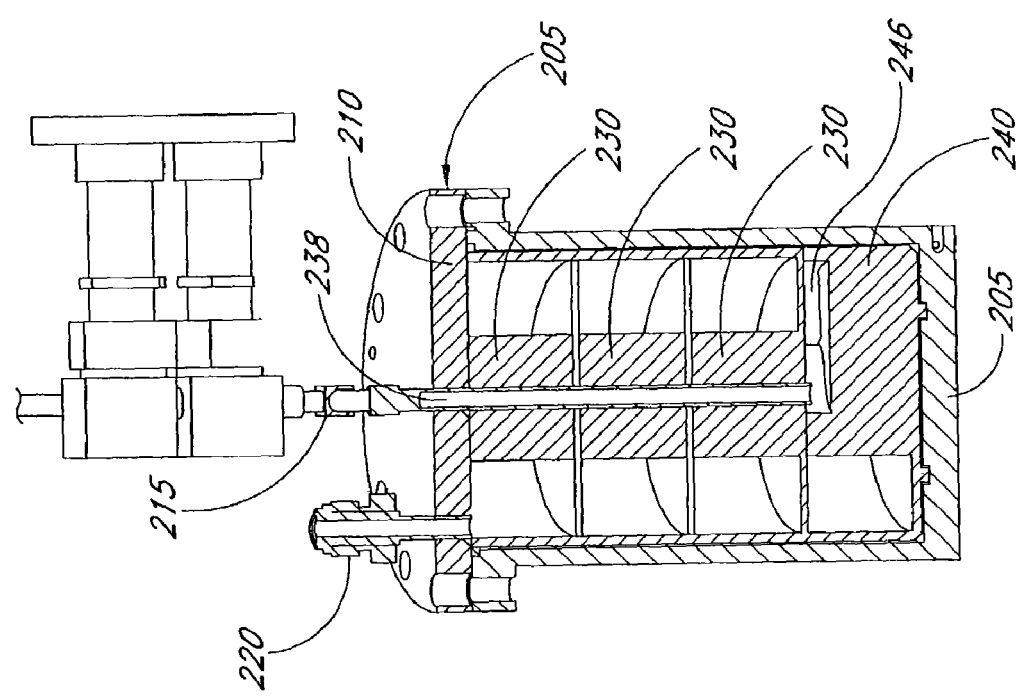
FIG. 19 is a partially cutaway perspective view of the vessel of FIG. 10.

The vessel 200 is assembled as shown in the exploded view of FIG. 18 and the assembled cross section of FIG. 19. The main compartments 235, 245 for each of the upper trays 230 and the lower tray 240 are loaded with solid precursor, preferably in the form of powder. The lower tray 240 and plurality of upper trays 230 are stacked upon one another and loaded into the outer or external container 205. The trays 230, 240 are aligned by the pegs 239, 249 and corresponding holes such that gas flows into each tray, preferably at least flowing a lap of greater than 200° (up to about 355 degrees) around the main compartment and then up into the channel compartment 236 of the overlying upper tray 230. The lid 210 is then closed and sealed over the external container 205, and a central pipe extending from the lid extends down through the central channels 238 of the upper trays 230 to open into the channel compartment 246 of the lower tray 240. This loading and assembly operation is preferably conducted in a glove box. In certain preferred embodiments, a spring or similar device (not shown) is often placed below 240 to bias all trays together, preventing leaks from the central core to a different level.

In operation, inert gas is preferably provided through an inlet pipe, and experiences a long and winding flow route horizontally, preferably through at least a 200° arc and preferably at least 350° of the main compartment in each tray 230, 240 before vertically exited that tray. In the illustrated embodiment, inert carrier gas is provided through a central inlet 215 that extends down through the aligned central channels 238 of the upper trays 230 to open into the channel compartment 246 of the lower tray 240. The inert gas winds through the solid precursor in the main compartment 245 until encountering an opening in the lower surface of the overlying upper tray 230. This opening allows the carrier gas, and the vaporized precursor it carries with it, to pass into the channel compartment 236 of the overlying upper tray 230, from which the gas passes through the screen 233 (see FIG. 14) and into the main compartment 235. The gas winds through solid precursor in that main compartment 235, preferably through at least an arc of 200° and preferably at least 350° before encountering an opening in the lower surface of the overlying upper tray 230, etc. At the uppermost upper tray 230, the gas is allowed to exit through the outlet conduit 220. It will be understood, of course, that the flow path can be reversed if desired.

In preferred embodiments described above in which the carrier gas preferably travels in only one direction in each tray (i.e. about one lap), the pulse of the carrier gas is preferably substantially saturated with the precursor vapor by contacting the carrier gas with the solid precursor along a carrier gas contact pathway with a residence time at least 1× greater (i.e., double) than that needed for a desired pulse duration, but preferably 5× greater than the pulse duration. The skilled artisan would realize that, in light of the disclosure herein, the void volume height in the main compartment should be such that the diffusion time from solid surface to top of the channel is less than the gas residence time.

The void volume height is dependent on the flow rate of the carrier gas through the tray. Minimum path length is preferably defined such that the residence time of the fluid (carrier and vapor) is greater than the desired pulse time in pulsed flow mode and preferably greater than 5 residence times during continuous flow (or very long pulses) operation. For example, for a gas velocity of 1.3 m/sec, the length of the flow channel is desirably at least 1.3 meters to ensure that a substantially saturated pulse is sent to the reactor in pulsed mode or more preferably 6.5 meters in length (5×1.3) to ensure substantial saturation. If the time between pulses is too short in pulsed flow mode, sub-saturation could result because the vapor phase has too little time to replenish itself from subliming solid. The 1.3 m/sec gas velocity is dependent on a carrier flow rate of 800 sccm and channel cross sectional area. If the flow rate is reduced, the length also goes down proportionately. If only 200 sccm of substantially saturated $N_2$ gas is needed for the ALD reactor design, then the minimum and preferred lengths would be lowered accordingly.

The maximum vessel volume (no powder or trays) is preferably 12 in. diameter by 16 in. high, giving an empty vessel volume of $3 \times 10^7$ $mm^3$. The initial solid source fill would preferably be greater than 50% of this volume. The tray minimum volumes and fill percentages are preferably the same for the embodiments shown in FIGS. 20A–20C.

Figure 20C:
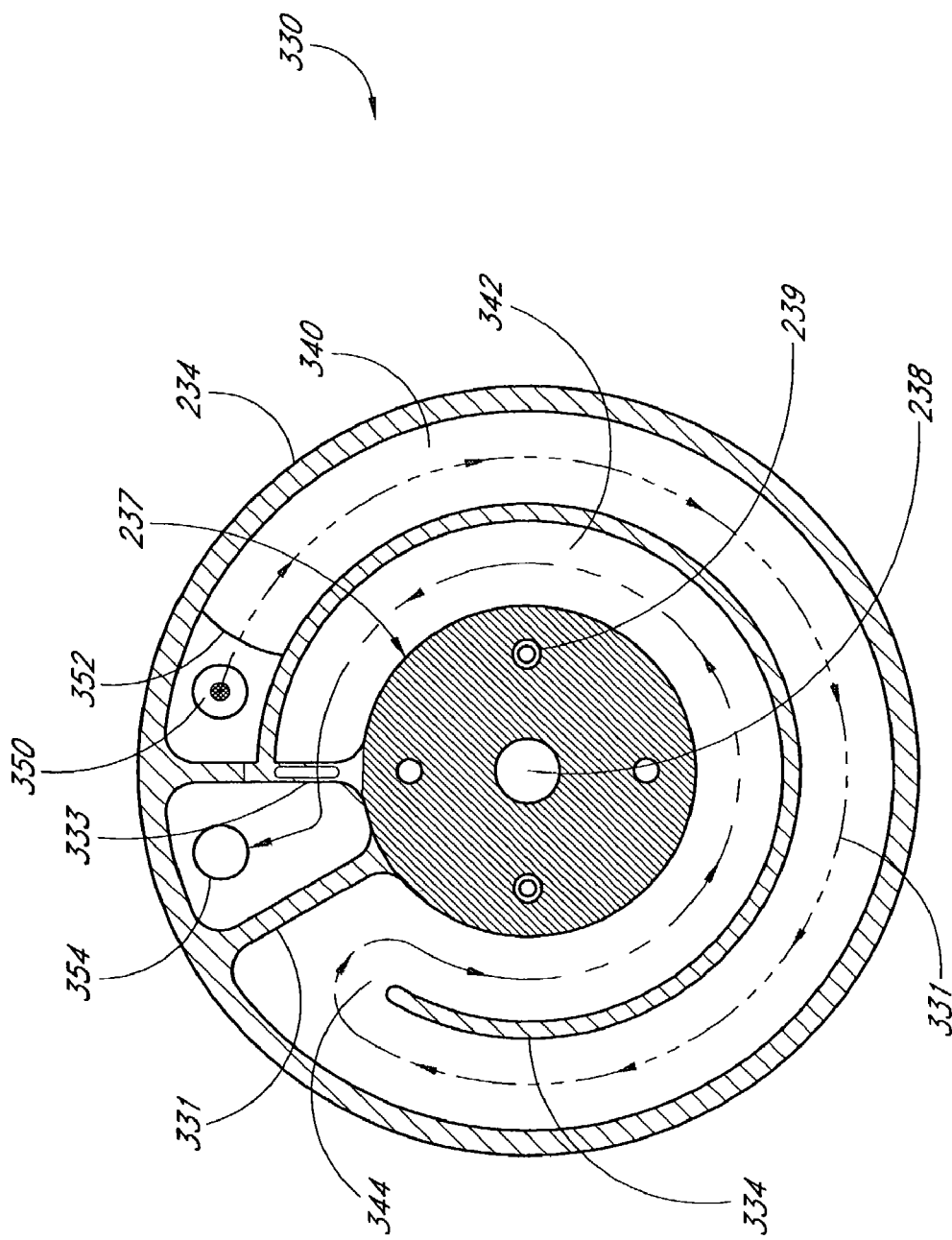
FIG. 20C is a top plan view of an upper stacking tray having a secondary partial divider, in accordance with an alternate arrangement of the tray shown in FIG. 20B.

In a preferred embodiment shown in FIGS. 20A–20C, one or more of divided trays 328, 329, or 330 is employed in the vessel system shown in FIG. 18. FIG. 20A shows a divided lower tray 328, while FIG. 20B shows an upper tray 329. With reference to both FIGS. 20A and 20B, the divided tray 330 includes a secondary partial divider 334 partially dividing (in the horizontal direction) the main compartment into a first path 340 and a second path 342, as compared with tray 230 (FIG. 15) which has a single path in the form of main compartment 235. The secondary partial divider 334 is configured to guide the carrier gas flow 331 to travel in one direction around the tray preferably at least about a 200° arc (more preferably at least 300°) on a first tray path 340 and, then, turn 180° around and travel preferably at least about a 200° arc (more preferably at least 300°) in the opposite direction on a second tray path 342 before exiting the tray 330. The first tray path 340 is connected to the second tray path 342 by a gap 344 in the secondary partial divider 334 which serves to join the end of the first tray path 340 with the beginning of the second tray path 342. This gap 344 is where the carrier gas flow 331 is guided to performs a "U-turn" of about 180° and change directions to begin traveling the second tray path 342. In certain preferred embodiments, the corners to which the flow is exposed at proximate to the gap 344 are rounded to minimize flow stagnation from sharply angled corners. An inlet conduit feeds into at inlet 350 at the beginning of the first tray path 340, preferably having a filter plate 335 which extends to substantially prevent powder from entering both the inlet 350 and the outlet 354 located at the end of the second tray path 342. The outlet 354 serves as an exit for the carrier gas flow 331 from the second tray path 342 to an overlying tray (not shown) via the outlet conduit (not shown).

In the divided lower tray 328 shown in FIG. 20A, the inlet conduit enters the tray in the center and channels the gas to the first path 340. Although shown as a straight inlet conduit, in other preferred arrangements the inlet conduit is curved in order to begin curving the carrier gas flow into the preferred helical path defined by the secondary partial divider 334. The outlet 354 channels the carrier gas flow 331 to an inlet conduit of an overlying upper tray 329. With reference to FIG. 20B, the inlet conduit feeds into the inlet 350 and the carrier gas flow 331 then is channeled to travel in one direction around the tray preferably at least about 200° (more preferably at least 300°) on a first tray path 340 and, then, turn around and travel preferably at least about 200° (more preferably at least 300°) in the opposite direction on a second tray path 342.

The embodiment shown in FIG. 20C also has a secondary partial divider 334 configured to guide the carrier gas flow 331 to travel in one direction around the tray, preferably at least about 200° (more preferably at least 300°), on a first tray path 340 and, then, turn around and travel preferably at least about 200° (more preferably at least 300°) in the opposite direction on a second tray path 342 before exiting the tray 330. A filter 333 is located at the end of the second tray path 342 before an outlet 354 at the end of the second tray path 342. The outlet 354 serves as an exit from the second tray path 342 to an overlying tray (not shown) via the outlet conduit (not shown).

In an alternate embodiments, the trays shown in FIGS. 20A–20C are configured so that the direction of the carrier gas flow is reversed, e.g. the components are arranged so that the first tray path is the innermost path and the second tray path is the outermost path in the tray or vice versa. It should be noted that employing the trays shown in FIGS. 20A–20C increase (relative to the tray shown in FIG. 15) the effective length of the sublimation bed thereby increasing the average residence time.

In contrast with U.S. Pat. No. 6,270,839, the tortuous or convoluted path winds in a horizontal direction through the bulk of solid source material in each tray. The structure disclosed in the '839 patent, in contrast, contains no teachings to encourage flow horizontally along the length of each cartridge. Rather, the flow path taught by the '839 patent is assumed to be equally resistive at any point along an annulus in each cartridge, such that channeling at one or more discrete points along the annulus can still result.

Preferred arrangements of the aforementioned embodiments also employ a heater (not shown) located in the sublimation apparatus 29. The heater is used to maintain a solid source precursor in the vessel 1 at or above a temperature needed to effect a significant vapor pressure of the solid source precursor. As noted above, in a preferred embodiment, the heat source comprises a radiant heater, which is placed within an evacuated sublimation apparatus 29. Reflectors (not shown) are preferably utilized in the sublimation apparatus 29 to reflect the radiant energy to the vessel 1. Further detail regarding the heater in the sublimation apparatus can be found in U.S. Provisional Application 09/854,706 filed May 14, 2001 and entitled "Method And Apparatus For Feeding Gas Phase Reactant into a Reaction Chamber," the disclosure of which is hereby incorporated by reference for this purpose.

Figure 21:
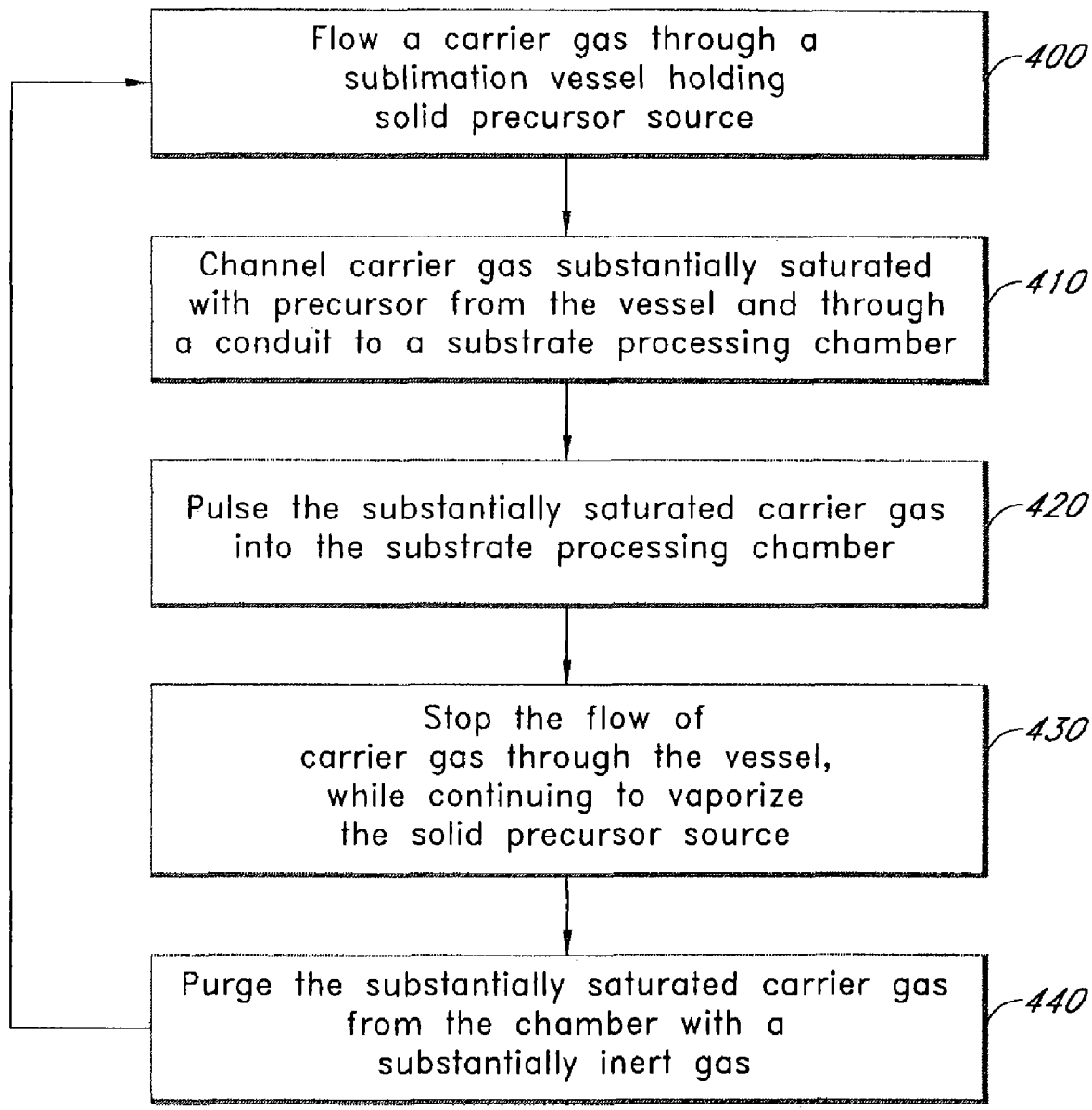
FIG. 21 is a flow chart of a method of performing an atomic layer deposition (ALD) process to deposit a layer on a substrate surface, in accordance with an embodiment of the present invention.

FIG. 21 shows a method of performing an atomic layer deposition (ALD) process to deposit a layer on a substrate surface. In this process, a flow of carrier gas through the vessel is interrupted such that the reactant vapor pressure intermittently builds up in the vessel. A carrier gas is contacted 400 with a precursor vapor from a solid precursor source in a sublimation vessel so that the carrier gas is substantially saturated with the precursor vapor. The substantially saturated carrier gas is channeled 410 from the vessel and through a conduit to a substrate processing chamber. The substantially saturated carrier gas is then pulsed 420 into the substrate processing chamber. The flow of substantially saturated carrier gas from the vessel is stopped 430 while vaporization continues in the closed vessel and the substantially saturated carrier gas is purged 440 from the chamber with a substantially inert gas. In a preferred embodiment of the method shown in FIG. 21 producing the pulse of the carrier gas substantially saturated with the precursor vapor comprises heating the solid precursor to affect a vapor pressure between 0.1 and 100 Torr.

Pulsing, stopping, and purging comprise a cycle and the cycle is repeated at least twice during the deposition of the layer. Preferably, the recharge period of the sublimation vessel is less than the time required to purge the reaction chamber or preferably 100 milliseconds to 5 seconds between stopping the flow (or isolating the sublimation vessel from the processing chamber) and a next pulsing of the substantially saturated carrier gas into the substrate processing chamber. Preferably, the duration of each pulsing in a cycle comprises at least 50 milliseconds, more preferably 0.1–10 seconds and, after each cycle is completed, the substrate surface is substantially saturated with adsorbed species of the precursor vapor, i.e. the adsorbed precursor occupies all available reaction sites on the substrate accounting for steric hindrance. Preferably, each pulse is substantially saturated for at least 100,000 pulsing cycles. More preferably, each pulse is substantially saturated for at least 500,000 cycles.

It should be noted that the method shown in FIG. 21 illustrates the cycle for each single reactant. The method steps shown can be easily adapted in view of FIG. 9 (employing a first and second reactant) to include alternating two or more different reactants.

In one preferred embodiment, no more than one monolayer of the precursor is deposited per cycle. More preferably, each cycle deposits a layer having a thickness of about 1–5 Å. In one embodiment, a second carrier gas with a second precursor vapor from a second solid precursor source is employed so that the carrier gas is substantially saturated with the second precursor vapor. More typically, a second precursor is naturally gaseous, such as $NH_3$, $O_2$, etc.

Preferably, the sublimation vessel design produces a substantially plug flow residence time distribution inside the vessel. This, in turn, is beneficial for creating a saturated carrier gas as it flows along the primary axis of the vessel, which is advantageous for ALD processing. Preferably, producing the pulse of the carrier gas substantially saturated with the precursor vapor comprises contacting the carrier gas with the solid precursor source along a gas contact pathway with a channel length much greater than its width. In one preferred embodiment, producing the pulse of the carrier gas substantially saturated with the precursor vapor comprises contacting the carrier gas with the solid precursor source that coats a support medium.

Preferred arrangements of the aforementioned embodiments have carrier gas guidance structures configured to maximize the amount of solid source surface area which the carrier gas contacts in order that the carrier gas picks up sufficient vapor reactant to be saturated over each pulse length. This repeated saturation preferably occurs even under operating conditions where the saturation of the carrier gas continues for greater than 100,000 pulses of carrier gas, each pulse lasting for greater than 0.1 seconds and more preferably up to about 30 seconds, e.g., in high aspect ratio structures where the vapor reactant diffuses down into a wafer trench. A heat source preferably increases the vapor pressure over the solid source for a vapor reactant. Preferably, the carrier gas guidance structure is configured to ensure contact of the carrier gas with the vapor reactant along a long and winding contact pathway having a length greater than about double the linear distance measured from the inlet port to the outlet port. More preferably, the carrier gas guidance structure is configured to ensure contact of the carrier gas with the vapor reactant along a non-linear (e.g., winding and segregated) contact pathway having a length greater than about 2.5 times, more preferably 4 times, a linear distance measured from the inlet port to the outlet port.

The preferred embodiments facilitate high carrier gas conductance rate as a result of the large amount of open void volume in the sublimation bed while, at the same time, preventing the conductance of the sublimation bed from varying greatly over time as the solid source material is depleted. In certain preferred embodiments, under atomic layer deposition (ALD) conditions, the support medium or the guidance structure is further configured to facilitate the repeated saturation of the carrier gas with the vapor reactant when the time between successive pulses is greater than 0.400 seconds.

In considering the configuration of sublimation vessels described herein, it should be noted that increasing the duration of each pulse has a tendency to decrease the ability of the vessel to repeatedly saturate a carrier gas, if all other variables are held constant. Furthermore, increasing the number of cycles also tends to decrease the ability of the vessel to repeatedly saturate a carrier gas. Nevertheless, the preferred embodiments disclosed herein are capable of substantially saturating a carrier gas with vapor reactant even under relatively long duration pulses and/or after a relatively large number of pulses. In other words, the preferred embodiments are capable of saturating a carrier gas with vapor reactant (from a solid source) under conditions which would quickly exhaust a conventional sublimation bed and result in an unsaturated carrier gas and poor deposition. In comparison, the preferred embodiments disclosed herein are not only capable of substantially saturating a carrier gas with vapor reactant under typical ALD conditions, but also even under relatively extreme ALD conditions, e.g., over a very high number of pulses of the same reactant and/or very long pulses and/or with very short periods of time between pulses.

It should be noted the time between successive pulses is partially dependent on whether the substrate processing system is configured to process a single wafer at a time or multiple wafers at once (e.g., a batch process) and/or very large substrates (e.g., flat panel displays). In embodiments employing single wafer reaction chambers, the time between successive pulses of the same reactant is preferably less than 30 seconds and, more preferably less than 10 seconds.

Typically, the pulse duration is less than between 3%–40% of the cycle length, more typically 10%–25% of the cycle length, for 2-reactant cycles. In the case of batch processes and/or very large substrates are processed, a cycle can range as high as 2–5 minutes. Nevertheless, the skilled artisan will appreciate that the solid source vessels described herein will facilitate substantial saturation for any design of ALD equipment and any commercially viable pulsing sequences. As a result of these longer cycles, the sublimation vessel parameters disclosed herein would be scaled to account for these longer process times while maintaining the typical pulse duration to the cycle length (e.g. 3%–40% or 10%–25%).

In designing and optimizing the performance of preferred embodiments of the present invention, the "effective bed distance" of the sublimation bed will also be considered. The "actual bed distance" is the distance between where carrier gas first contacts a solid source chemical, regardless of whether the solid source material is exhausted or unexhausted, until the point where carrier gas no longer can contact solid source material, which is generally at the point where the carrier gas is channeled out of the sublimation bed. The actual bed distance remains constant and does not change over the life of the bed, as compared with the effective bed distance, which decreases in length over time as solid source material is exhausted. In operation, as carrier gas is introduced at one end of a sublimation bed, the gas picks up vapor reactant from solid source material as it moves along the length of the bed. Assuming steady flow conditions, the solid source material located closest to the inlet for the carrier gas will become depleted before the solid source material located further along the sublimation bed, while the solid source material located furthest from where the carrier gas enters will be the last to become depleted. If the gas flow rate is fixed, then at a certain effective bed position, or saturating position, the carrier gas will be saturated with the solid source. At any point in the bed beyond this position, the carrier gas will still be saturated. As a bed is depleted under steady state conditions, this saturation position normally shifts closer to the carrier gas outlet over time as the solid erodes, but the distance between the beginning of the effective bed distance and the saturation point remains constant until the bed is depleted to the point where it can no longer saturate the carrier gas at a constant flow rate and temperature. Preferred embodiments of the present invention are designed to allow for this pattern of bed depletion over time while maintaining saturation until depletion approaches the downstream end of the vessel. Preferred embodiments also result in the carrier gas being substantially saturated with precursor vapor. The carrier gas is considered substantially saturated with precursor vapor if it contains between 90% and 100% of material saturation vapor pressure under the vessel conditions (e.g., temperature and pressure) at the outlet.

In designing and optimizing preferred embodiments to reasonably approach a plug flow mixing behavior, i.e., to produce a substantial plug flow, the following equations are useful. At steady state the concentration [C(z)] as a function of bed position is given by the following equations:

$$z_c = Q/A*k,$$ (Equation 1)

where Q is volumetric flow rate of gas, A is cross-sectional area to flow, and k is the rate constant for solid material sublimation (assumed to be first order) and, after $z_c$ is determined using equation (1), the carrier concentration at any position can be found or the physical length (z) for a desired concentration can be found.

$$C(z) = C_{sat}\left[1 - e^{-\frac{z}{z_c}}\right]$$ (Equation 2)

The sublimation bed is preferably designed such that its physical length exceeds $z_c$, thus facilitating the carrier gas reaching saturation.

Preferably, the sublimation bed is also configured to have a safety margin. The additional length accounts for uncertainties in the reaction rate expression or use of the plug flow reactor idealization and, also, accounts for material consumption over time. The safety margin also allows the bed to sustain saturation of the carrier gas flow at gas flow rates higher than the design flow rate for a envisioned for the typical fabrication process. For example, preferred embodiments of the present invention employ a sublimation bed having an effective bed length which is designed to repeatedly sustain saturation of the carrier gas at 1.25 times the maximum carrier flow rate for many thousands and more preferably several hundred thousand cycles, where each cycle is on the order of about 1 second. Preferably, the structure will sustain a pulse for greater than 0.020 slm equivalent pure precursor (and for about 10× that for carrier and chemical) when used in conjunction with a single wafer reactor (e.g., 300 mm wafer size), more preferably, greater than 0.040 slm pure precursor (0.4 slm with the carrier flow), and greater than 0.5 slm in pure precursor when used in conjunction with a batch wafer reactor, more preferably, greater than 1 slm. Desirably, the structure is selected to enable repeated saturation of the carrier gas with the solid source for a vapor reactant for greater than 100,000 successive pulses, each pulse lasting for about 0.1–10 seconds.

Figure 22A:
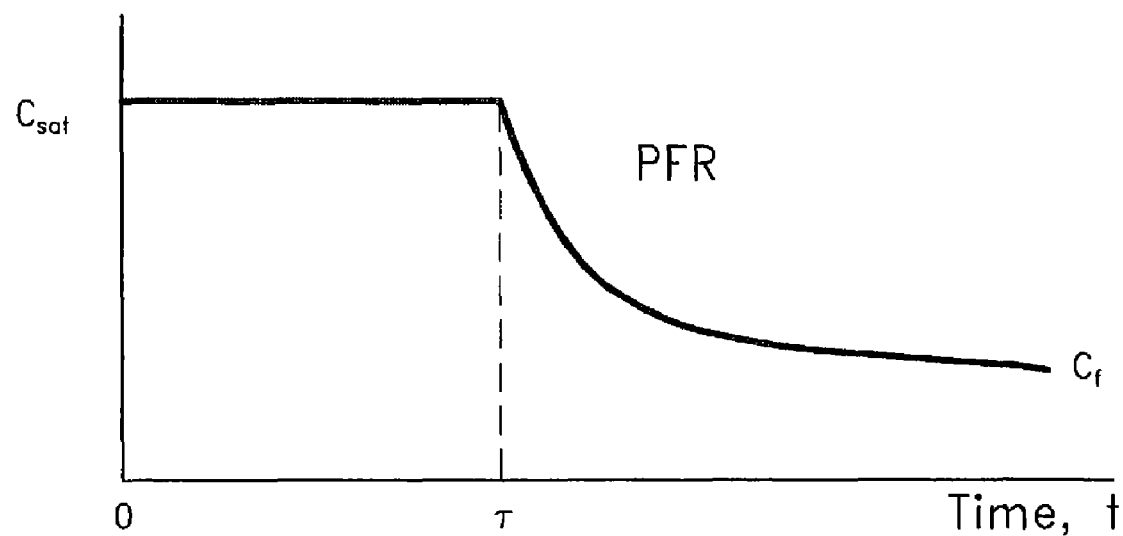
FIG. 22A shows a graph illustrating the saturated concentration ($C_{sat}$) of precursor in the carrier gas over time in an ideal plug flow reactor.

In certain preferred embodiments, the sublimation bed is capable of producing a flow which approaches an idealized residence time distribution known as plug flow. Ideal plug flow implies that there is infinite mixing of fluid particles in the radial direction and no mixing in the axial (flow) direction. In addition, ideal plug flow also implies a uniform velocity profile across the channel perpendicular to flow and that the residence time is a constant. For example, in an ideal plug flow reactor tube having alternating red slices and green slices moving through the tube, the two color slices would enter and exit the tube with no exchange of color. FIG. 22A shows a graph of illustrating the saturated concentration ($C_{sat}$) of precursor in the carrier gas over time in an ideal plug flow reactor (or sublimation vessel). The graph in FIG. 22A represent the following equation for conversion (i.e., conversion of pure carrier gas to saturated carrier gas) in a plug flow reactor (first order sublimation rate assumed):

$$C_f = C_{sat}(1-\exp(-k\tau))$$ (Equation 3)

where $C_f$ is the precursor concentration at the vessel outlet, $C_{sat}$ is the saturation concentration of the material, k is a constant, and $\tau$ is time.

Figure 22B:
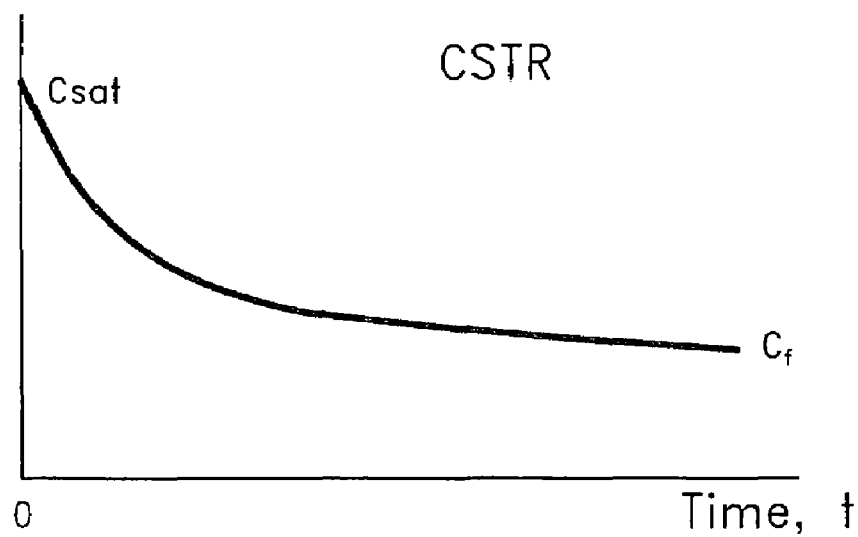
FIG. 22B shows a graph illustrating the saturated concentration ($C_{sat}$) of precursor in the carrier gas over time in an ideal stirred tank reactor.

At the other extreme of fluid mixing models is a stirred tank model in which infinite diffusivity or complete mixing is obtained. FIG. 22B shows a graph of the precursor concentration at the vessel outlet for an ideal stirred tank. The graph in FIG. 22B represents the following equation, $$C_f = (k\tau C_{sat})/(1+k\tau)$$ (Equation 4)

The two extreme idealizations of fluid mixing (i.e. plug flow and stirred tank) can be compared. For equal flow rates $\tau$ is proportional to the reactor volume. Choosing a value of $k\tau$ of 4.0 it can readily be seen that the degree of saturation will be much higher in a reactor with PFR mixing vs. the stirred tank idealization. In essence, a PFR allows for the highest known conversion of pure carrier into saturated carrier.

Of course, this is an idealization and there is no such thing as perfect plug flow or an ideal stirred tank in reality. However, certain preferred embodiments disclosed herein have a residence time distribution (RTD) that approaches plug flow. An ideal plug flow is characterized by the following equation:

$$D_L/uL = 0,$$

where $D_l$=effective diffusivity of the reactor, u=the axial velocity of the flow, and L=vessel or reactor length.

In comparison, an ideal stirred tank model is characterized by the following equation:

$$D_L/uL = \infty.$$

The degree to which these embodiments approach plug flow can be determined by using a dispersion model equation, such as Equation 5 below, and fitting D/uL to the experimentally collected vessel response curve to a step change in concentration at the vessel inlet.

$$\left(\frac{C}{C_o}\right)_{step} = \frac{1}{2}\left[1 - \mathrm{erf}\left(\frac{1}{2}\sqrt{\frac{uL}{D_L}} \frac{1 - \theta/\bar{\theta}}{\sqrt{\theta/\bar{\theta}}}\right)\right] \quad \text{(Equation 5)}$$

The response curves for various dispersion models, including plug flow and stirred tank models, are shown in FIG. 22. For example, one method to determine the actual sublimation vessel residence time response of the preferred embodiments is to send in a pulse of $N_2$ when the sublimation vessel or reactor is filled with Helium (He) and then measure the He concentration change with a mass spectrometer. Preferred embodiments exhibit a substantial degree of plug flow behavior, thereby producing a substantial plug flow, which is defined for purpose of the present disclosure when their actual residence time response is substantially equal to a residence time response observed in a dispersion model reactor vessel with D/uL<0.025 or a tubular reactor (or a sublimation bed employing trays) exhibiting a response curve similar to a laminar flow reactor, where none of the fluid has a residence time less than half the average residence time Additional detail regarding model flow reactors can be found in Smith, J. M., *Chemical Engineering Kinetics*, 3rd Edition, McGraw-Hill Book Company, p. 268–291 (1981), the disclosure of which is incorporated by reference for this purpose.

Preferred embodiments result in the carrier gas being substantially saturated with precursor vapor. The carrier gas is considered substantially saturated if the carrier gas contains between about 90% and 100% of the maximum amount of precursor vapor possible under the conditions (e.g., temperature and pressure) within the sublimation vessel or "reactor". Certain preferred embodiments, rather than being limited to pure plug flow arrangements, are configured in accordance with other models (e.g., series of stirred tanks, laminar flow reactor, or dispersion reactors with low $D_l/uL$ values) that are close enough to the idealization to allow the production of multiple, consecutive pulses of carrier gas substantially saturated with precursor vapor.

In certain preferred embodiments employing packed flowable support members coated with solid source, performance approximating a plug flow reactor PFR or a dispersion reactor with low $D_L/uL$ is achieved. Preferably, a packed bed reactor of cylindrical type geometry closely approximates plug-flow because the packing (tortuous path) gives very good mixing in the radial (R) direction, but very little mixing along its length. Additional detail regarding packed bed reactors can be found are covered in Smith, J. M., *Chemical Engineering Kinetics*, 3rd Edition, McGraw-Hill Book Company, p. 554–563 (1981), the disclosure of which is incorporated by reference for this purpose.

The following calculations are useful when considering the parameters of the guided powder bed shown in FIGS. 10–20C. The following equations are also useful for comparing diffusive mass transfer time over channel height and residence time.

The diffusive mass transfer time from the solid source surface to the top of the channel, i.e., over the channel height, is described by:

$$\tau_{diff} \sim \frac{2.3H^2}{D_{12}} \quad \text{(Equation 6)}$$

where H is the height of the channel (gas phase), and $D_{12}$ is the diffusion coefficient. $\tau_{diff}$ is the concentration of $HfCl_4$ at the top of the channel reaches 90% of the concentration at the solid surface.

The residence time of the gas along the channel is given by the following:

$$\tau_{rsd} = \frac{L}{v} \quad \text{(Equation 7)}$$

For following conditions: 150 Torr, 200° C., $N_2$ 800 sccm and $HfCl_4$ species, with the channel dimensions: W~13 mm, H~7 mm, L~2000 mm (channel center line), the average velocity at the cross section is about 1.3 m/s and the diffusion coefficient $D_{12}$ is estimated as $8.44 \times 10^{-5}$ m$^2$/s, the following can be obtained:

$$\tau_{diff} = \frac{2.3 \times 7^2 \times 10^{-6}}{8.44 \times 10^{-5}} \approx 1.3 \text{ (sec)} \quad \text{(Equation 8)}$$

$$\tau_{rsd} = \frac{2000 \times 10^{-3}}{1.3} \approx 1.5 \text{ (sec)} \quad \text{(Equation 9)}$$

If the temperature is changed to 160° C., and the flow rate is changed to 300 sccm $N_2$, time for diffusion does not change, but the residence time is increased to 4.4 sec.

EXAMPLE 1

In preferred embodiments of the present invention, the effective bed length is increased greatly without necessitating a proportionate increase in the length of the sublimation vessel. This increase in effective length is facilitated by guidance structures, including support elements coated with solid source material and flow guides, each of the guidance structures being configured to channel the carrier gas through contact pathways designed to saturate the carrier gas over a relatively short distance (as measured by the direct distance between the carrier gas inlet and the outlet) and to expose the carrier gas to a large surface area of subliming solid source material.

A non-limiting example of potential sublimation bed parameters made possible by solid source coated beads, or spheres, as determined by the Alcoa CSS computer program, follows in Table 1:

TABLE 1

Potential Sublimation Bed Parameters Using Non-Porous Spheres and an HfCl$_4$ Coating

| | |
|---|---|
| Sphere Diameter (mm) | 4 |
| Bed Diameter (mm) | 40 |
| Bed Length (mm) | 300 |
| Coating Thickness (mm) | 0.25 |
| Bed Volume (mm$^3$) | 376991.1 |
| Bed Porosity (void fraction) | 0.33 |
| Sphere Volume (mm$^3$) | 33.51032 |
| Number of Spheres | 7537.5 |
| Total Volume of Packing (L) | 0.252584 |
| HfCl$_4$ volume (mm$^3$) | 107052.2 |
| Mass of HfCl$_4$ (g) | 299.7462 |
| Surface Area (cm$^2$) | 3788.761 |

With reference to Table 1, the preferred embodiment features, including a low coating thickness relative to the sphere diameter, relatively high bed porosity (i.e., void fraction), and large, overall solid surface area, are numerically illustrated.

EXAMPLE 2

In certain preferred embodiments, the sublimation bed is capable of producing a substantially plug flow, i.e. approaches an ideal plug flow. One advantage of configuring preferred embodiments to flow a substantial plug flow is that ideal plugged flow residence time distribution (or plug flow mixing behavior) effectuates a concentration at the vessel outlet which stays constant with time up to the vessel residence time (V/Q, where V=vessel volume and Q is the volumetric flow rate). If you make the residence time of the reactor much longer than the pulse time, the entire pulse length will remain at $C_{sat}$. Therefore, if reactor or vessel (holding the powder or precursor coated support medium) is long and/or convoluted (e.g., coiled path, helically guided path, tortuous path through coated beads, etc), then the residence time is high. Advantageously, in preferred embodiments employing ALD, each pulse of flow into the vessel will preferably push a "slice" of carrier gas saturated with precursor vapor out. For example, if the flow rate through the vessel is 1000 cm$^3$/min (sccm), the channel is 2.5 cm×2.5 cm, and k is 0.1/sec, then a length of 80 cm gives a 30 sec. residence time. The saturation percentages achieved by other sublimation reactor lengths under the same conditions are shown in Table 2 below. Even if the 80 cm reactor is flowed longer than 30 sec., the plug flow distribution still gives the highest degree of saturation. Assuming that sublimation is a first order process, the plug flow reactor (PFR) gives the highest degree of conversion or approach to saturation of the reactor designs shown in Table 3 below, most notably compared to a stirred volume. It is therefore desirable for embodiments to attempt to approach the PFR and produce a substantial plug flow, which is accomplished by moving the gas unidirectionally over the material with minimized axial dispersion/mixing.

It is likely in reality that the order of the sublimation rate will change from 1$^{st}$ order at some time and allow 100% saturation to be achieved, even under steady flow (i.e., constant pulse with no vessel isolation), if the carrier gas contact pathway is long enough. However, even assuming the kinetics do not change order, a critical tube length or carrier gas contact pathway (and resulting V/Q) can still be defined such that the conversion (or saturation) is greater than 90%, or even greater than 99%, with the plug flow idealization of the embodiments disclosed herein.

TABLE 2

Saturation Percentages for Various Reactor Lengths

| Reactor Length (cm) | Average residence time (theta) | % Saturation |
|---|---|---|
| 10 | 3.74251497 | 0.312196091 |
| 20 | 7.48502994 | 0.526925782 |
| 30 | 11.22754491 | 0.674617703 |
| 40 | 14.97005988 | 0.776200784 |
| 50 | 18.71257485 | 0.846070025 |
| 60 | 22.45508982 | 0.894126361 |
| 70 | 26.19760479 | 0.927179697 |
| 80 | 29.94011976 | 0.949913911 |
| 90 | 33.68263473 | 0.965550592 |
| 100 | 37.4251497 | 0.976305563 |

TABLE 3

Conversion vs. Residence Time Distribution for First Order Kinetics

| Type of Reactor | Conversion | Residence Time Distribution (RTD) |
|---|---|---|
| Plug-flow reactor | 0.63 | $D_L/uL = 0$ |
| Actual tubular reactor | 0.61 | |
| Stirred-tank reactor | 0.50 | $D_L/uL = \infty$ |
| Dispersion model | 0.60 | $D_L/uL = 0.117$ |
| Series STR model | 0.60 | n = 5 |

EXAMPLE 3

Figure 23:
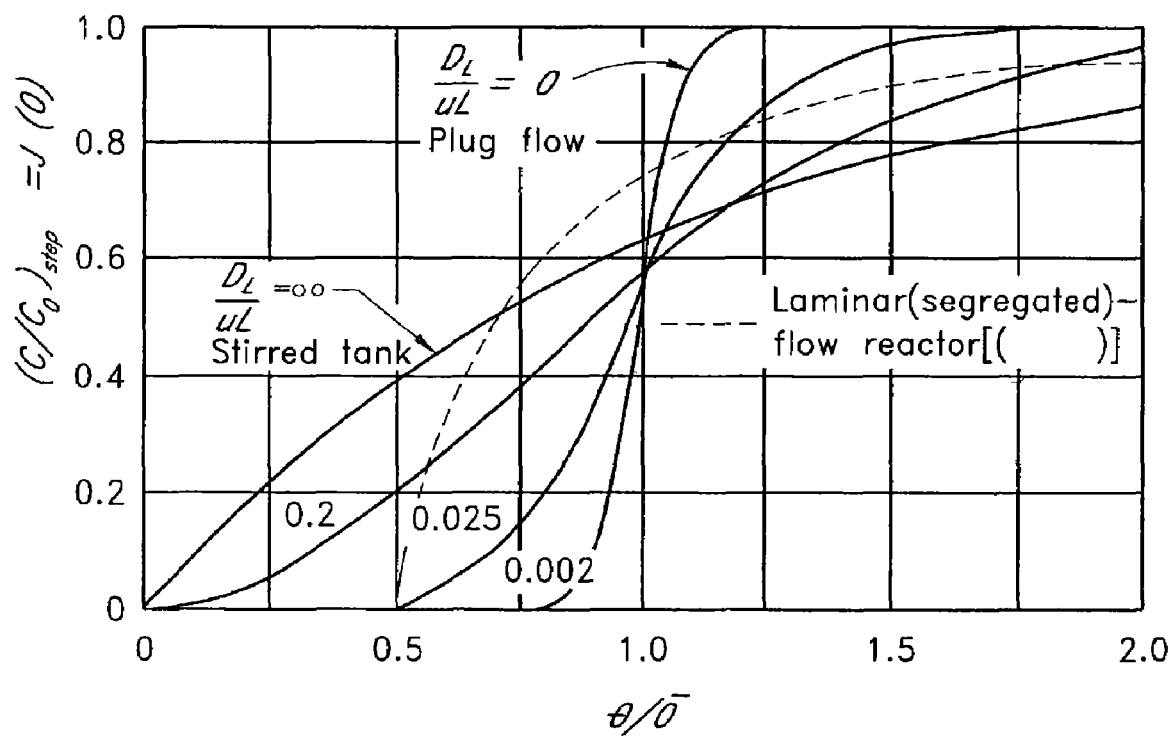
FIG. 23 shows the response curves for various dispersion models, including plug flow and stirred tank models.
Figure 24:
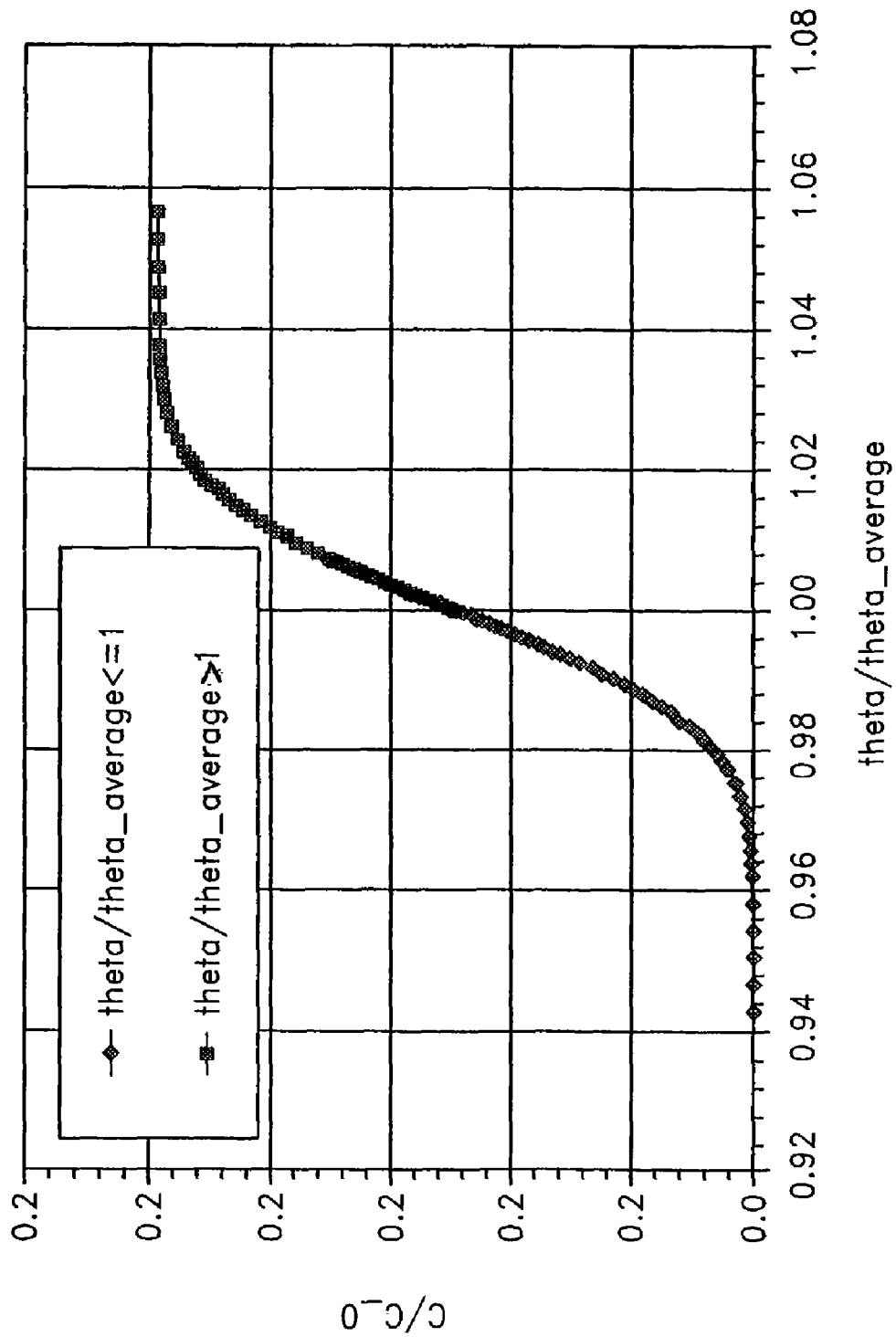
FIG. 24 is a graph of the plotted fluid mechanical modeling results of the vessel embodiments shown in FIGS. 15–20B, the graph showing the residence time distribution (RTD).

The preferred embodiments shown in FIGS. 15–20B were modeled and the results are represented by the plot shown in FIG. 24, showing the residence time distribution (RTD) curve for the vessel with shelves. The plot shown in FIG. 24 is the result of a fluid mechanical modeling of packed vessel embodiments and it shows that the RTD is very close to that of an ideal PFR. The individual data points are shown in Table 4 below. The plotted results substantially equates to a dispersion model whith a very low $D_L/uL$. In other words, the resulting curve is similarly shaped to the plug flow curve in FIG. 23. This plotted curve shows the response of the vessel to a step function change in concentration at the inlet. This is the J(theta), or Residence Time Distribution (RTD) function. Its conventional definition is the fraction of the effluent stream having a residence time less than theta.

$C_0$ is the concentration of the tracer fluid step at the inlet and C is its concentration at the outlet. At time zero, there is none of the tracer fluid in the reactor, but the fluid going into the reactor is changed to have a concentration $C_0$. $C/C_0$ is a dimensionless group that will go from 0 to 1. The graph shown in FIG. 23 shows how long it takes, in terms of number of average residence time (dimensionless or scaled) to achieve 1 and the shape of the curve. The plot shown in FIG. 24 is a standard way of showing the mixing behavior of sublimation vessels (or any volume that carries fluid).

TABLE 4

Results Of Fluid Mechanical Modeling Of Packed Vessel Embodiments

| fraction >1 theta/theta_average | C/C_0 | fraction <1 theta/theta_average | C/C_0 |
|---|---|---|---|
| 0.999996 | 0.499998 | 0.942862 | 1E-05 |
| 1.000377 | 0.511278 | 0.946671 | 4E-05 |
| 1.000758 | 0.522553 | 0.95048 | 0.00012 |
| 1.001139 | 0.533808 | 0.954289 | 0.000345 |
| 1.001519 | 0.545002 | 0.958098 | 0.00093 |
| 1.0019 | 0.556227 | 0.961907 | 0.00234 |
| 1.002281 | 0.567377 | 0.963811 | 0.003605 |
| 1.002662 | 0.578472 | 0.965716 | 0.005455 |
| 1.003043 | 0.589502 | 0.96762 | 0.008105 |
| 1.003424 | 0.600467 | 0.969525 | 0.011825 |
| 1.003805 | 0.611347 | 0.971429 | 0.016945 |
| 1.004186 | 0.622147 | 0.973333 | 0.02386 |
| 1.004567 | 0.632847 | 0.975238 | 0.032995 |
| 1.004947 | 0.643447 | 0.977142 | 0.044845 |
| 1.005328 | 0.653937 | 0.977904 | 0.05045 |
| 1.005709 | 0.664312 | 0.978666 | 0.056605 |
| 1.00609 | 0.674562 | 0.979428 | 0.063335 |
| 1.006471 | 0.684677 | 0.980189 | 0.070675 |
| 1.006852 | 0.694662 | 0.980951 | 0.07865 |
| 1.007233 | 0.704502 | 0.981713 | 0.08729 |
| 1.007614 | 0.714192 | 0.982475 | 0.096615 |
| 1.008375 | 0.733107 | 0.983237 | 0.106655 |
| 1.009137 | 0.751372 | 0.983998 | 0.117292 |
| 1.009899 | 0.768947 | 0.98476 | 0.128949 |
| 1.010661 | 0.785806 | 0.985522 | 0.141229 |
| 1.011423 | 0.801926 | 0.986284 | 0.154284 |
| 1.012184 | 0.817291 | 0.987046 | 0.168109 |
| 1.012946 | 0.831886 | 0.987807 | 0.182704 |
| 1.013708 | 0.845711 | 0.988569 | 0.198069 |
| 1.01447 | 0.858766 | 0.989331 | 0.214189 |
| 1.015232 | 0.871046 | 0.990093 | 0.231049 |
| 1.015993 | 0.882703 | 0.990854 | 0.248624 |
| 1.016755 | 0.893341 | 0.991616 | 0.266889 |
| 1.017517 | 0.903381 | 0.992378 | 0.285804 |
| 1.018279 | 0.912706 | 0.992759 | 0.295494 |
| 1.01904 | 0.921346 | 0.99314 | 0.305334 |
| 1.019802 | 0.929321 | 0.993521 | 0.315319 |
| 1.020564 | 0.936661 | 0.993902 | 0.325434 |
| 1.021326 | 0.943391 | 0.994282 | 0.335683 |
| 1.022088 | 0.949546 | 0.994663 | 0.346058 |
| 1.022849 | 0.955151 | 0.995044 | 0.356548 |
| 1.024754 | 0.967001 | 0.995425 | 0.367148 |
| 1.026658 | 0.976136 | 0.995806 | 0.377848 |
| 1.028563 | 0.983051 | 0.996187 | 0.388648 |
| 1.030467 | 0.988171 | 0.996568 | 0.399528 |
| 1.032372 | 0.991891 | 0.996949 | 0.410493 |
| 1.034276 | 0.994541 | 0.99733 | 0.421523 |
| 1.036181 | 0.996391 | 0.997711 | 0.432618 |
| 1.038085 | 0.997656 | 0.998091 | 0.443768 |
| 1.041894 | 0.999066 | 0.998472 | 0.454994 |
| 1.045703 | 0.999651 | 0.998853 | 0.466188 |
| 1.049512 | 0.999876 | 0.999234 | 0.477443 |
| 1.053321 | 0.999955 | 0.999615 | 0.488718 |
| 1.05713 | 0.999985 | 0.999996 | 0.499998 |

The plot shown in FIG. 24 is the result of a fluid mechanical modeling of packed vessel embodiments and it shows that the RTD is very close to that of an ideal PFR. Comparing to RTDs in FIG. 23, it is very close to PFR and has a $D_L/uL=8.4\times10^{-5}/(1.3*2)\approx3.2\times10^{-5}$. Advantageously, the $C/C_o$ of certain packed bed preferred embodiments does not even start deviating from 0.0 until 0.96 (theta/theta average). The curve of $D_L/uL$ of 0.002 is already above C/Co of 0.5. If the scale of the above plot is changed from 0–2.0, the comparison between FIGS. 23 and 24 are even more evident.

A feature of the preferred embodiments is improved vapor/solid contact time and improved solid source surface area to vapor volume ratio as a result of, among other factors, the avoidance of problematic "tunneling." Another feature of preferred embodiments is enhanced vapor/solid contact time. Yet another feature of preferred embodiments is the allowance of relatively even gas flow resistance over the life of a sublimation bed. Another feature of certain preferred embodiments is the production of a carrier gas flow substantially saturated with precursor in the sublimation vessel, which is substantially exhibiting plug flow mixing behavior. Each of these features preferably contributes to an ability to saturate carrier gas in each pulse over an extended number of pulses without recharging the solid source material. Accordingly, a predictable amount of reactant is provided in each pulse, allowing far greater control over semiconductor processing, particularly ALD.

Although the invention has been disclosed in the context of certain preferred embodiments and examples, it will be understood by those skilled in the art that the present invention extends beyond the specifically disclosed embodiments to other alternative embodiments and/or uses of the invention and obvious modifications thereof. Thus, it is intended that the scope of the present invention herein disclosed should not be limited by the particular disclosed embodiments described above, but should be determined only by a fair reading of the claims that follow.

We claim:

1. A sublimation apparatus for producing a vapor reactant for flowing through a reaction chamber, comprising:
a sublimation vessel;
a plurality of beds of solid source for the vapor reactant, each solid source bed contained within the vessel and in the form of a solid powder;
a carrier gas guidance structure with which the solid source is directly in contact, the carrier gas guidance structure configured to guide a carrier gas to contact the solid source for the vapor reactant by providing a substantially helical pathway for the carrier gas, wherein the carrier gas guidance structure comprises:
a plurality of stacked trays, each tray containing one of the beds of the solid source and confining the carrier gas to a single path from a tray inlet to a tray outlet, the single path defining one of a plurality of levels of the helical pathway, the carrier gas being in contact along the single path with the solid source in each tray;
a vessel inlet port located at the beginning of the substantially helical pathway provided by the carrier gas guidance structure; and
a vessel outlet port located at the end of the substantially helical pathway provided by the carrier gas guidance structure,
wherein the carrier gas guidance structure is configured to ensure contact of the carrier gas with the solid source for the vapor reactant along the substantially helical pathway having a length greater than about 2.5 times a linear distance measured from the vessel inlet port to the vessel outlet port.

2. The sublimation apparatus according to claim 1, wherein the guidance structure is a flow guide configured to extend from a sublimation vessel floor to a sublimation vessel ceiling.

3. The sublimation apparatus according to claim 1, wherein the single path of at least one of the plurality of stacked trays comprises at least one substantially circular pathway, the at least one substantially circular pathway being configured to guide the carrier gas at least one lap of at least about 200° around the tray before channeling the carrier gas through the tray outlet to the inlet of an adjacent tray.

4. The sublimation apparatus according to claim 1, wherein at least one of the plurality of stacked trays comprises a secondary partial divider which partially defines at least two substantially circular pathways of the single path, the secondary partial divider in combination with tray sidewalls being configured to guide the carrier gas about two laps around the tray before channeling the carrier gas to an adjacent stacked tray, each lap being at least about 200° around the tray.

5. The sublimation apparatus according to claim 4, wherein the two substantially circular pathways are configured to channel the carrier gas in substantially opposite directions relative to one another.

6. The sublimation apparatus according to claim 1, wherein the carrier gas guidance structure comprises a central inlet that extends from the vessel inlet port vertically through an aligned central channel of the upper tray to open into a channel compartment of a lowermost tray.

7. The sublimation apparatus according to claim 6, wherein the lowermost tray includes a partial divider that allows gas flow thereover.

\* \* \* \* \*